United States Patent
Perrissin-Fabert et al.

(10) Patent No.: US 10,818,329 B2
(45) Date of Patent: Oct. 27, 2020

(54) MAGNETIC TUNNEL JUNCTION WITH PERPENDICULAR SHAPE ANISOTROPY AND MINIMISED VARIATION OF TEMPERATURE MEMORY POINT AND LOGIC ELEMENT INCLUDING THE MAGNETIC TUNNEL JUNCTION, METHOD OF MANUFACTURING THE MAGNETIC TUNNEL JUNCTION

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); INSTITUT POLYTECHNIQUE DE GRENOBLE, Grenoble (FR)

(72) Inventors: Nicolas Perrissin-Fabert, Grenoble (FR); Bernard Dieny, Grenoble (FR); Lucian Prejbeanu, Grenoble (FR); Ricardo Sousa, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 0 days.

(21) Appl. No.: 16/282,873

(22) Filed: Feb. 22, 2019

(65) Prior Publication Data
US 2019/0287591 A1    Sep. 19, 2019

(30) Foreign Application Priority Data
Feb. 23, 2018 (FR) .................... 18 51605

(51) Int. Cl.
*G11C 11/16* (2006.01)
*H01L 27/22* (2006.01)
(Continued)

(52) U.S. Cl.
CPC ........ *G11C 11/161* (2013.01); *H01F 10/3268* (2013.01); *H01F 10/3286* (2013.01);
(Continued)

(58) Field of Classification Search
CPC ............... G11C 11/161; H01F 10/3286; H01F 10/3268; H01L 43/12; H01L 43/10; H01L 43/08; H01L 43/02; H01L 27/228
(Continued)

(56) References Cited

U.S. PATENT DOCUMENTS

| 8,247,093 | B2 | 8/2012 | Rodmacq et al. |
| 8,513,944 | B2 | 8/2013 | Rodmacq et al. |

(Continued)

OTHER PUBLICATIONS

Search Report as issued in French Patent Application No. 1851605, dated Jan. 21, 2019.
(Continued)

*Primary Examiner* — Fernando L Toledo
*Assistant Examiner* — Adam S Bowen
(74) *Attorney, Agent, or Firm* — Pillsbury Winthrop Shaw Pittman LLP

(57) ABSTRACT

A magnetic tunnel junction with out-of-plane magnetisation includes a storage layer; a reference layer; and a tunnel barrier layer. The two magnetisation states of the storage layer are separated by an energy barrier including a contribution due to the shape anisotropy of the storage layer and a contribution of interfacial origin for each interface of the storage layer. The storage layer has a thickness comprised between 0.8 and 8 times a characteristic dimension of a planar section of the tunnel junction. The contribution to the
(Continued)

energy barrier due to the shape anisotropy of the storage layer is at least two times greater and preferably at least 4 times greater than the contributions to the energy barrier of interfacial origin.

20 Claims, 17 Drawing Sheets

(51) Int. Cl.
*H01L 43/02* (2006.01)
*H01L 43/08* (2006.01)
*H01L 43/10* (2006.01)
*H01L 43/12* (2006.01)
*H01F 10/32* (2006.01)

(52) U.S. Cl.
CPC ............ *H01L 27/228* (2013.01); *H01L 43/02* (2013.01); *H01L 43/08* (2013.01); *H01L 43/10* (2013.01); *H01L 43/12* (2013.01)

(58) Field of Classification Search
USPC ........................................................ 257/421
See application file for complete search history.

(56) References Cited

U.S. PATENT DOCUMENTS

| | | | |
|---|---|---|---|
| 10,326,073 B1* | 6/2019 | Tzoufras | H01L 43/14 |
| 10,439,131 B2* | 10/2019 | Siddik | H01L 43/08 |
| 2011/0044099 A1* | 2/2011 | Dieny | G11C 11/16 365/171 |
| 2012/0299134 A1 | 11/2012 | Jan et al. | |
| 2013/0188421 A1* | 7/2013 | Dieny | B82Y 25/00 365/158 |
| 2015/0036415 A1 | 2/2015 | Di Pendina et al. | |
| 2017/0178705 A1* | 6/2017 | Buhrman | H01L 43/08 |
| 2017/0365357 A1* | 12/2017 | Kobayashi | G11C 11/161 |
| 2018/0123031 A1* | 5/2018 | Adelmann | H01L 27/228 |
| 2019/0206931 A1* | 7/2019 | Gajek | H01L 27/228 |
| 2019/0207102 A1* | 7/2019 | Gajek | H01L 27/228 |

OTHER PUBLICATIONS

Watanabe, K., et al., "Shape anisotropy revisited in single-digit nanometer magnetic tunnel junctions," Nature Communications, vol. 9, No. 1, Feb. 2018, XP055513325, 6 pages.

* cited by examiner

MAGNETIC TUNNEL JUNCTION WITH PERPENDICULAR SHAPE ANISOTROPY AND MINIMISED VARIATION OF TEMPERATURE MEMORY POINT AND LOGIC ELEMENT INCLUDING THE MAGNETIC TUNNEL JUNCTION, METHOD OF MANUFACTURING THE MAGNETIC TUNNEL JUNCTION

CROSS-REFERENCE TO RELATED APPLICATIONS

This application claims priority to French Patent Application No. 1851605 filed Feb. 23, 2018, the entire content of which is incorporated herein by reference in its entirety.

TECHNICAL FIELD OF THE INVENTION

The present invention relates to a magnetic device including a variable magnetisation layer having a magnetic anisotropy perpendicular to the plane of the layers mainly induced by the shape of the variable magnetisation layer. The invention firstly relates to a magnetic tunnel junction. The invention secondly relates to a memory point including the magnetic tunnel junction. The thermal variation of the magnetic and electrical properties over the operating temperature range is minimised. The invention thirdly relates to a non-volatile logic element including the magnetic tunnel junction. These devices notably find application in the spintronics field in particular for the production of magnetic random access memories (MRAMs) operating over a wide temperature range notably for automobiles, industrial applications, the space field but also for consumer electronics, high performance computing, the internet of things. The invention fourthly relates to a method for manufacturing the magnetic tunnel junction according to the invention.

PRIOR ART

In order to meet recurrent needs to increase the density of memories for CMOS electronics, the size of devices continually decreases. However, the memories the most commonly used as working memories ("Dynamic Random Access Memories", DRAMs and "Static Random Access Memories", SRAMs) are volatile, that is to say that they have to be supplied continuously with voltage to conserve the information. They have more and more energy consumption problems, notably in static mode, on account of an increased leakage current linked to their reduction in size. The FLASH memories used for the storage of data or codes are non-volatile, that is to say that they conserve their data in the absence of power supply, but have a writing endurance limited to at the most 100,000 cycles and their production in embedded version is complex, requiring 15 to 20 mask levels.

Different dense non-volatile memory technologies, with writing endurance and easier to integrate in CMOS technology than embedded FLASH memories, are under development. They are very interesting in order to reduce energy consumption. Among the different technologies of non-volatile memories (phase change memories, resistive oxide memories, ferroelectric memories, etc.), magnetic random access memories (MRAMs) combine a unique set of advantages: apart from their non-volatility, they are rapid in writing (~20 ns), rapid in reading (several ns), may be produced in a dense manner (approaching the density of DRAMs), and have a much better writing endurance than that of FLASH memories ($>10^{10}$ cycles for MRAMs compared to $<10^5$ cycles for FLASHs). They are thus particularly interesting for being integrated in electronic circuits. This type of memory is based on magnetic tunnel junctions, formed by two ferromagnetic layers separated by an insulating oxide, generally of magnesium oxide MgO. The resistance of the device typically varies by a factor comprised between 3 and 4 between a minimum resistance state $R_{min}$ obtained when the magnetisations of the two ferromagnetic layers are parallel to each other to a value $R_{max}$ when they are in antiparallel alignment, thereby providing a numerical "0" or a "1". Tunnel magnetoresistance (TMR) is defined as being the ratio $TMR=(R_{max}-R_{min})/R_{min}$. In an electronic circuit, non-volatility makes it possible to reduce energy consumption by switching off the temporary inactive parts of the circuit and thus by eliminating the leakage current in these parts. New power gating strategies are thereby made possible. The concept of electronic computing in a circuit normally off with instant on (Normally-Off/Instant-On computing) has even been introduced to describe this approach ("Challenges toward gigabit-scale spin-transfer torque random access memory and beyond for normally off, green information technology infrastructure", Takayuki Kawahara, J. Appl. Phys. 109, 07D325, 2011).

Different families of magnetic memories have been developed over the last 20 years. They essentially differ by the manner in which information is written in the memory points. Writing in a MRAM memory comes down to orienting the magnetisation of one of the magnetic electrodes of the tunnel junction (electrode called storage layer) parallel or antiparallel to the magnetisation of the second electrode of fixed magnetisation called reference layer. In the first family of MRAMs, the writing was done by magnetic field pulses. Commercially available products of the EVERSPIN™ Company called Toggle MRAM have used this writing method since 2006. However, the density of these memories is limited to several Mbits because the current required to produce magnetic field pulses (~10 mA), does not make it possible to descend to technological nodes below 90 nm.

The second family of MRAMs that is attracting the most attention today is the family of MRAMs written by spin transfer torque (STT). They are known as STT-MRAMs. The phenomenon of spin transfer was predicted in 1996 by Slonczewski (Slonczewski, J. C., 1996, "Current driven excitations of magnetic multilayers," J. Magn. Magn. Mater. 159, L1-L7) and Berger (Berger, L., 1996, "Emission of spin waves by a magnetic multilayer traversed by a current", Phys. Rev. B 54, 4828-4830) and the possibility of using this phenomenon for switching the magnetisation of magnetic layers was demonstrated experimentally for the first time in 2000 (Katine, J. A., F. J. Albert, R. A. Buhrman, E. B. Myers, and D. C. Ralph, 2000, "Current-driven magnetization reversal and spin-wave excitations in Co/Cu/Co pillars," Phys. Rev. Lett. 84, 3149-3152).

The use of spin transfer for writing in a magnetic tunnel junction provides a better configuration, in particular when the density is high, that is to say when the memory is of small size (typically less than 50 nm diameter).

Two parameters are very important for describing the performances of a STT-MRAM. The first is the thermal stability factor $\Delta=E_b/K_BT$. In this expression, $E_b$ represents the energy barrier separating the two stable states of the magnetisation of the storage layer, that is to say the energy barrier that has to be overcome to switch the magnetisation of the storage layer from parallel to antiparallel to that of the reference layer or vice versa from antiparallel to parallel depending on the value that it is wished to write in the memory point ("0" or "1"). This energy barrier is linked to the magnetic anisotropy of the storage layer. This parameter is very important because it determines the memory retention time, that is to say how long the memory manages to conserve the information that has been written before thermal fluctuations erase this information. It also makes it possible to estimate the error rate on standby or during reading as a function of time and the capacity of the memory. As is known to those skilled in the art, for memories of capacity of the order of 1 Gbit, thermal stability factors of the order of 80 are required but the exact value of the $\Delta$ required depends on the error rate that is tolerated (B. Dieny, L. Prejbeanu, chapter Magnetic Random Access Memory, in Introduction to Magnetic Random Access Memory, edited by B. Dieny, R. B. Goldfarb, K. J. Lee, IEEE Press, J. Wiley). The first STT-MRAMs that were developed have a planar magnetisation, that is to say that the magnetisations of the storage layer and the reference layer are oriented on standby in the plane of the layers. The anisotropy of the storage layer is then most often obtained by giving to the magnetic tunnel junction a shape elongated in the plane, in particular an elliptical shape characterised by a large axis typically 2 to 3 times greater than the small axis of the ellipse. At this moment, the magnetisation has a tendency to align itself with the large axis of the ellipse which constitutes the easy magnetisation axis, the small axis being à contrario the difficult magnetisation axis. The height of the energy barrier to make the magnetisation of the storage layer pass from one direction to the opposite direction by coherent rotation is given by the following approximate expression (Apalkov, D., B. Dieny and J. M. Slaughter, Magnetoresistive Random Access Memory, Proceedings of the IEEE 104 (2016) 1796-1830): $E_b = \mu_0 \pi^2 (M_s L)^2 w (AR-1)$ where $\mu_0$ is the permittivity of a vacuum, $M_s$ the magnetisation of the storage layer, L the thickness of the storage layer, w the width of the ellipse (dimension of the small axis), AR the aspect ratio of the ellipse that is to say the ratio of the length of the large axis divided by the length of the small axis. In these MRAMs with planar magnetisation, the aspect ratio is in general limited to 3 at the most because beyond this the reversal of the magnetisation no longer takes place by coherent rotation of the magnetisation but by nucleation and propagation of walls. The barrier height then practically no longer increases with the aspect ratio.

More recently, as will be explained hereafter, interest in STT-MRAMs has been concentrated on magnetic tunnel junctions with magnetisation orientated out-of-plane. This is due to two main reasons. On the one hand, it is possible to create anisotropies much stronger in perpendicular anisotropy than in planar anisotropy, notably by playing on interfacial anisotropy phenomena. This makes it possible to reduce the size of the memory points while retaining a sufficient thermal stability factor. On the other hand, for a same given thermal stability factor, that is to say for a given retention time, it is known that the critical switching current is much lower for junctions with perpendicular magnetisation than for junctions with planar magnetisation. This will be explained in greater detail hereafter.

STT-MRAMs of the prior art (FIGS. 1a and 1b) are based on a phenomenon of perpendicular anisotropy at the magnetic metal/oxide interfaces (U.S. Pat. No. 8,247,093 (B2), U.S. Pat. No. 8,513,944 (B2)). This phenomenon has been observed with different oxides (AlOx, MgO, TaOx, CrOx) and different magnetic materials based on Co, Fe and alloys thereof but is particularly interesting at the CoFeB/MgO interfaces in the context of STT-MRAMs (Ikeda, S., K. Miura, H. Yamamoto, K. Mizunuma, H. D. Gan, M. Endo, S. Kanai, J. Hayakawa, F. Matsukura, and H. Ohno, 2010, "A perpendicular-anisotropy CoFeB—MgO magnetic tunnel junction," Nature Mater. 9, 721-724). This interfacial anisotropy is often noted $K_s$. It is an energy per surface unit which may be of the order of 1 to 2 mJ/m² at the CoFeB/MgO interface. It has been shown that this anisotropy is higher at the Fe/MgO interface than it is at the Co/MgO interface (Yang, H. X., M. Chshiev, B. Dieny, J. H. Lee, A. Manchon, and K. H. Shin, 2011, "First principles investigation of the very large perpendicular magnetic anisotropy at Fe|MgO and Co|MgO interfaces," Phys. Rev. B 84, 054401). This interfacial perpendicular anisotropy suffices in conventional STT-MRAMs to draw the magnetisation of the storage layer out-of-plane by exceeding the shape anisotropy which rather has a tendency to bring back the magnetisation back in-plane in so far as the thickness of the storage layer is much less than its diameter in STT-MRAMs of the prior art.

In order to further increase the interfacial anisotropy of the storage layer, it has also been proposed to insert the storage layer between two oxide barriers (see FIG. 1b). This makes it possible to benefit from two interfaces between one and the other of the oxide barriers and the magnetic storage layer (U.S. Pat. Nos. 8,247,093(B2); 8,513,944(B2); Sato, H., T. Yamamoto, M. Yamanouchi, S. Ikeda, S. Fukami, K. Kinoshita, F. Matsukura, N. Kasai, and H. Ohno, 2014, "Comprehensive study of CoFeB—MgO magnetic tunnel junction characteristics with single- and double-interface scaling down to 1× nm," in Proceedings of the International Electron Devices Meeting (IEDM), San Francisco, 33.2.1-33.2.4).

In tunnel junctions with perpendicular magnetisation in which the storage layer generally has a flattened cylinder shape (that is to say having a thickness much less than the diameter), the energy barrier separating the two magnetisation states of the storage layer ("upwards" magnetisation or "downwards" magnetisation) is given by:

$$E_b = A\left[K_{s1} + K_{s2} - \frac{\mu_0}{2}(N_{xx} - N_{zz})M_s^2 L + K_u L\right]$$

In this expression, A represents the surface (area) of the storage layer, $K_{s1}$ and $K_{s2}$ represent the interfacial anisotropies at the two upper and lower interfaces of the storage layer, $N_{xx}$ and $N_{zz}$ are demagnetising field coefficients along the direction x (direction chosen arbitrarily in-plane given the symmetry of revolution) and z (out-of-plane), $\mu_0$, $M_s$ and L have been defined previously, $K_u$ is a potential volume anisotropy for example of magnetocrystalline or magnetoelastic origin. In general, this energy is negligible compared to the other contributions to the anisotropy for materials commonly used in STT-MRAMs. As regards $N_{xx}$ and $N_{zz}$, as long as the thickness of the layer is much less than its diameter, this gives $N_{xx} \sim 0$ and $N_{zz} \sim 1$. When the thickness is no longer much less than the diameter, an approximate expression of $N_{xx}-N_{zz}$ is (M. Sato and Y. Ishii, J. Appl. Phys. 60, 983 (1989)):

$$N_{xx} - N_{zz} = \frac{1}{2}\left(1 - \frac{3}{1+2f\,AR}\right),$$

where f=1 in the case of a rectangular parallelepiped with square base and $$f = \frac{2}{\sqrt{\pi}}$$

in the case of a cylinder with circular base. This expression is practical for analytical calculations but more precise values of these demagnetising field coefficients may be found in the publication Du-Xing Chen, James A. Brug, Member, IEEE, and Ronald B. Goldfarb, Demagnetizing Factors for Cylinders, IEEE Trans. Mag. 4, 3601 (1991) or in the following publication for elliptical shaped cylinders: M. Beleggia, M. De Graef, Y. T. Millev, D. A. Goode and G. Rowlands, Demagnetization factors for elliptic cylinders, J. Phys. D: Appl. Phys. 38 (2005) 3333.

It should be recalled that by convention, in magnetism, when an anisotropy is positive, it tends to orient the magnetisation out-of-plane of the layer. Conversely, when the anisotropy is negative, it tends to orient the magnetisation in-plane.

In STT-MRAMs with perpendicular anisotropy of the prior art, the interfacial anisotropy term $A(K_{s1}+K_{s2})$ is positive whereas the term $$-A\left[\frac{\mu_0}{2}(N_{xx}-N_{zz})M_s^2 L\right]$$

linked to the shape anisotropy of the storage layer is negative such that the two terms are in competition. This is problematic in STT-MRAMs of the prior art because it prevents increasing the thickness t of the storage layer. Indeed, by increasing this thickness, the relative weight of the planar shape anisotropy is increased compared to the perpendicular interfacial anisotropy which reduces the total effective anisotropy. It is for this reason that in conventional perpendicular STT-MRAMs, the thickness of the storage layer is limited to values of the order of 1.4 nm for junctions with single tunnel barrier and to around 2 nm for junctions with double barrier.

Another problem of MRAM memories of the prior art with out-of-plane magnetisation is that the barrier height is proportional to the surface area of the tunnel junction. The more that smaller and smaller technological nodes are approached, the more this surface area A decreases. Consequently $E_b$ decreases and there is always a diameter threshold below which the thermal stability factor becomes too small to ensure a sufficient retention and thus a sufficiently low error rate in the conservation of data written in the memory. Typically, with memories of the prior art, the critical diameter below which the height of the energy barrier becomes too low at 85° C. is situated at around 25 nm, at 150° C. it is situated at around 40 nm.

A second very important parameter for characterising a memory point STT-MRAM is its writing current $I_{c0}$. It is known to those skilled in the art that the writing current in a stT-MRAM depends on the duration of the writing current pulses. In the so-called thermally activated regime observed for pulses of duration typically above 10 ns, the writing current varies as:

$$I_c = I_{c0}\left\{1 - \frac{k_B T}{E_b}\text{Ln}\left(\frac{\tau}{\tau_0}\right)\right\}$$

where $\tau$ is the duration of the pulse and $\tau_0$ a characteristic test time of the order of 1 ns. The writing current thus varies linearly as a function of the logarithm of the duration of the pulses. $I_{c0}$ corresponds to the extrapolation of this linear behaviour for a pulse duration of 1 ns.

$I_{c0}$ is a very important parameter because it determines the size of the selection transistor connected to the tunnel junction. For a given resistance of the memory point, which is in general adjusted to be of the order of magnitude of that of the transistor in ON mode, this writing current is going to determine the writing voltage. The resistance*area (RA) product of the tunnel junction is in general adjusted by playing on the thickness of the tunnel barrier so that this voltage is situated around 0.3 to 0.5V, sufficiently low compared to the dielectric breakdown voltage of the tunnel barrier (~1.2 to 1.6V) to ensure quasi-unlimited writing endurance of the memory point. Furthermore, the writing current has an influence on the electrical consumption that it is sought to minimise most of the time especially for nomad applications or devices of the internet of things.

From a theoretical viewpoint, the writing current is given by the following expressions (Sun, J. Z, 2000, "Spin-current interaction with a monodomain magnetic body: A model study," Phys. Rev. B 62, 570-578):

For STT-MRAMs with planar magnetisation:

$$I_c^0 = A j_c^0 = \frac{A}{\eta}\frac{2\alpha e \mu_0}{\hbar}(M_s L)\left(\frac{H_\perp^{eff}}{2} + H_K\right).$$

In this expression, A is the area of the junction, $j_c^0$ is the critical current density for writing, $\eta$ is the efficiency of the spin transfer torque linked to the spin polarisation of the current injected into the storage layer at the moment of writing (typically ~80% for MgO barriers of the prior art), $\hbar$ is the reduced Planck's constant, e the absolute value of the charge of the electron, $\alpha$ is the Gilbert dampening of the constituent material of the storage layer, $M_s$ its magnetisation, L the thickness of the storage layer, e the charge of the electron, $\mu_0$ the permittivity of a vacuum. Furthermore, $H_\perp^{eff}$ represents the effective demagnetising field felt by the magnetisation of the storage layer if it points out-of-plane, this field being given by $$\mu_0 H_\perp^{eff} = \mu_0 M_s - 2\left(\frac{K_s}{L} + K_u\right).$$

Finally, $H_K$ is the planar anisotropy field which defines the memory retention, $H_K$ being given by $\mu_0 M_s H_K = E_b = \mu_0 \pi^2 (M_s L)^2 w(AR-1)$. As is known to those skilled in the art, in the case of magnetic tunnel junctions with planar magnetisation, the energy barrier to overcome to switch the magnetisation by STT (proportional to $$\left(\frac{H_\perp^{eff}}{2} + H_K\right)$$

is much higher than that which determines the memory retention (proportional to ($H_K$)). This is unfavourable because it signifies that, for a given memory retention, it is necessary to provide more current to overcome the higher barrier associated with the switching than necessary by virtue of the memory retention. This additional cost in current during switching comes from that fact that in its dynamic of switching by STT, the magnetisation is forced to come out-of-plane of the layer, which costs a lot of additional energy.

For STT-MRAMs with perpendicular magnetisation:

$$I_c^0 = A j_c^0 = \frac{A}{\eta} \frac{2\alpha e \mu_0}{\hbar} (M_s L)(H_k^{eff})$$

where the notations are the same as above and $H_k^{eff}$ represents the effective perpendicular anisotropy field felt by the magnetisation of the storage layer, which is given by:

$$\mu_0 H_K^{eff} = \mu_0 (N_{xx} - N_{zz}) M_s + \frac{2}{M_s}\left(\frac{K_{s1} + K_{s2}}{L} + K_u\right).$$

In STT-MRAMs of the prior art, this effective perpendicular anisotropy field is essentially due to the interfacial anisotropy at the interfaces between the storage layer and the two adjacent layers which are usually two oxide layers made of MgO. This anisotropy field is reduced by the demagnetising field expressed by the term $\mu_0(N_{xx}-N_{zz})M_s$ opposite to the anisotropy field term linked to the interfaces. The term in $K_u$ corresponds to the potential existence of a volume anisotropy of magnetocrystalline or magnetoelastic origin, in general negligible.

By combining the above two expressions with that given previously for the barrier height in perpendicular anisotropy, the following may be deduced:

$$I_c^0 = \left(\frac{4e}{\hbar}\right) \frac{\alpha E_b}{\eta}.$$

This relationship, valid from the moment that the magnetisation behaves in a macrospin manner, that is to say a uniform magnetisation block, shows that the writing current is directly proportional to the barrier $E_b$ which determines the memory retention. This is much more favourable than for planar tunnel junctions for which for an additional cost in writing current was necessary to achieve the switching of the magnetisation of the storage layer. This explains the greater interest of tunnel junctions with out-of-plane magnetisation for STT-MRAMs compared to junctions with planar magnetisation. However, in the prior art, it is known that the Gilbert dampening α increases for very thin layers due to spin pumping phenomena (Ikeda, S., K. Miura, H. Yamamoto, K. Mizunuma, H. D. Gan, M. Endo, S. Kanai, J. Hayakawa, F. Matsukura, and H. Ohno, 2010, "A perpendicular-anisotropy CoFeB—MgO magnetic tunnel junction," Nature Mater. 9, 721-724). This increases as much as the writing current which is proportional thereto.

Furthermore, for many microcontroller applications, it is desirable that the code making the microcontroller work is stored in a non-volatile memory of the microcontroller when the microcontroller is manufactured and that this information stored in the memory remains integrated during the soldering of the chip on its support (solder reflow compliance). This soldering step typically implies a rise in temperature to 260° C. for 1 minute. In STT-MRAM memories of the prior art, satisfying this condition is difficult due to the strong thermal variation of the interfacial anisotropy at the CoFeB/MgO interfaces. This imposes reinforcing the anisotropy such that it remains sufficiently strong at 260° C. to enable a retention of 1 minute at this temperature but as a result the anisotropy is even stronger at 25° C. or even at −40° C. which leads to a higher writing current and thus a higher writing consumption and a higher writing voltage, thus a reduced writing endurance.

FIG. 2 illustrates this. This figure shows the evolution as a function of temperature of the thermal stability factor of tunnel junctions of the prior art up to 260° C. To have an error rate per bit less than $10^{-4}$ for 60 seconds at 260° C. it is necessary that the thermal stability factor Δ satisfies the relationship $$\frac{t}{\tau_0}\exp(-\Delta) < 10^{-4}$$

where t=60 s, $\tau_0=10^{-9}$ s. This imposes Δ>34. FIG. 2 shows that this is only satisfied for the largest junctions of diameter greater than 100 nm. Furthermore, if the thermal variation of the stability factor is extrapolated to room temperature of 25° C., it is found that it reaches 115 which is much more than required per bit for a retention of 10 years. This implies that the writing current and the writing voltage will have to be over-dimensioned at 25° C. at the price of increased electrical consumption and reduced writing endurance to satisfy the retention criterion of 60 s at 260° C.

To summarise, the magnetic tunnel junctions of the prior art and the memory points that they use do not make it possible to:
  Reduce the variations of magnetic anisotropy over the temperature range of −40° C. to +260° C. making it possible to cover the range of operating temperatures for automobile, industrial, military applications and also to conserve the memory retention during the step of soldering the chip;
  Manage to conserve a sufficiently large thermal stability factor in tunnel junctions of which the diameter corresponds to the most advanced technological nodes (from 40 nm up to 4 nm);
  Minimise the writing current.

GENERAL DESCRIPTION OF THE INVENTION

To resolve at least partially these technical problems, the present invention relates to a magnetic tunnel junction with out-of-plane magnetisation including:
  a storage layer having a magnetisation switchable between two magnetisation states perpendicular to the plane of the layer;
  a reference layer having a fixed magnetisation and perpendicular to the plane of the layer;

a tunnel barrier layer separating the storage layer and the reference layer;

the two magnetisation states of the storage layer being separated by an energy barrier including a contribution due to the shape anisotropy of the storage layer and a contribution of interfacial origin for each interface of the storage layer, said magnetic tunnel junction being characterised in that:

the storage layer has a thickness comprised between 0.8 and 8 times a characteristic dimension of a planar section of the tunnel junction;

and in that the contribution to the energy barrier due to the shape anisotropy of the storage layer is at least two times greater than the contributions to the energy barrier of interfacial origin.

According to one embodiment the contribution to the energy barrier due to the shape anisotropy of the storage layer is at least four times greater than the contributions to the energy barrier of interfacial origin.

Energy barrier separating the two magnetisation states of the storage layer is taken to mean the energy difference between the minimum energy corresponding to the initial stable state of the magnetisation of the storage layer and the maximum energy encountered during the reversal of the magnetisation to its final stable state.

Planar section of the tunnel junction is taken to mean a section of the tunnel junction along the plane of the layers forming the tunnel junction.

Characteristic dimension of a planar section is taken to mean a dimension of said planar section. For example, in the case of a tunnel junction having a circular section, the characteristic dimension of a planar section of the tunnel junction may be chosen as being the diameter of the circle. In the case of an elliptical section, the characteristic dimension may be chosen as being the small axis or the large axis of the ellipse.

For example, the contribution to the energy barrier due to the shape anisotropy of the storage layer may be given by the following formula in the case of a storage layer of cylindrical shape:

$$-\frac{\mu_0}{4}\left(1 - \frac{3}{1 + 4AR/\sqrt{\pi}}\right)M_s^2(T)AL$$

For example, the contribution to the energy barrier of interfacial origin may be given by the following formula:

$A(K_{s1}+K_{s2})$

The explanation for the symbols used in these formulas has been given above.

It is possible to consider that these contributions to the energy barrier are calculated at a temperature $T_m$ being the average temperature of use of the magnetic junction.

The magnetic junction tunnel being used at temperatures comprised between $T_1$ and $T_2$, the temperature $T_m$ is for example defined as $T_m=(T_1+T_2)/2$.

Advantageously, the magnetic tunnel junction according to the invention makes it possible to increase the thickness of the storage layer. This makes it possible to reduce the influence of the operating temperature on the density of thermal fluctuations in the storage layer and thus at the same time, on the memory retention and the value of the writing current.

Advantageously, the increase in thickness of the storage layer enables the use of materials and of thicknesses having a lower Gilbert dampening and thus the minimisation of the writing current.

The principle of the invention may be explained in the following manner:

In the prior art, STT-MRAMs have always used very thin storage layers of which the thickness is much less than the diameter. This was motivated in particular by the fact that spin transfer being an interfacial phenomenon (taking place typically over the first nanometre from the interface through which the spin polarised current is injected), it is preferable to use very thin layers to as not to dilute the efficiency of the spin transfer torque. For such very thin layers, the shape anisotropy favours an in-plane orientation of the magnetisation of the storage layer and thus opposes the interfacial anisotropy which, for its part, favours a perpendicular orientation of this magnetisation. This leads to an effective anisotropy of relatively average amplitude resulting from the competition of these two anisotropy terms. Furthermore, this anisotropy strongly depends on the temperature because the thermal magnetisation develops more rapidly when the temperature increases in a very thin layer (thickness of the storage layer in STT-MRAMs of the prior art ~1.4 nm to 2 nm) than in a thick layer of the same material. The present invention proposes reducing this temperature dependency of the anisotropy by completely changing the paradigm by using a much thicker storage layer that is to say of which the thickness is at least 80% of a planar dimension characteristic of the storage layer (length of the small axis for a memory point of elliptical shape or diameter for a memory point of cylindrical shape) such that the shape anisotropy also favours an out-of-plane orientation of the magnetisation and even becomes the main source of perpendicular anisotropy of the storage layer. The basic idea is that the interfacial anisotropy at the CoFeB/MgO interfaces used in STT-MRAMs of the prior art depends much more strongly on temperature than the shape anisotropy of a thick layer which varies proportionally to $M_s^2$, knowing that for a thick layer the thermal variation of $M_s(T)$ is close to that of the bulk material of same composition. In the present patent, the shape anisotropy and the interface anisotropy have the same sign and thus add to each other such that both favour an orientation perpendicular to the plane of the layers of the magnetisation of the storage layer. However, since the interface anisotropy varies more rapidly with temperature than the shape anisotropy, it will be sought to increase the relative role of the shape anisotropy compared to the interface anisotropy to minimise the dependency of the total anisotropy at the operating temperature.

To clearly understand the idea, the most common case of a tunnel junction of which the storage layer has a quasi-cylindrical shape is used here. In this case and assuming that the storage layer is constituted of a single magnetisation material $M_s$, the energy barrier separating the two "upwards" and "downwards" magnetisation states may be expressed by:

$$E_b(T) = A\left[K_{s1}(T) + K_{s2}(T) - \frac{\mu_0}{4}\left(1 - \frac{3}{1 + 4AR/\sqrt{\pi}}\right)M_s^2(T)L + K_u(T)L\right]$$

This expression shows that from the moment that the aspect ratio of the storage layer exceeds $$AR = \frac{\sqrt{\pi}}{2} \approx 0.89$$

then the shape anisotropy term $$-\frac{\mu_0}{4}\left(1 - \frac{3}{1 + 4AR/\sqrt{\pi}}\right)M_s^2 L$$

changes sign to pass from negative to positive. In other words, for a thickness/diameter aspect ratio greater than 0.89, the shape anisotropy is added to the perpendicular interface anisotropy present at the tunnel barrier/storage layer interface. In this expression, the anisotropy $K_u$ of magnetocrystalline or magnetoelastic origin is in general negligible compared to the other anisotropy terms, with commonly used materials such as alloys based on Co, Fe and Ni deposited by cathodic sputtering. The barrier height $\Delta E(T)$ thus depends on temperature through the temperature dependency of the interfacial anisotropy $A(K_{s1}(T)+K_{s2}(T))$ and that of the shape anisotropy $$-\frac{\mu_0}{4}\left(1 - \frac{3}{1 + 4AR/\sqrt{\pi}}\right)M_s^2(T)At.$$

The thermal variations of these two anisotropy terms are compared below.

FIG. 3 shows typical variations of interfacial anisotropies such as those of the storage layers of magnetic tunnel junctions of the prior art. The figure shows in fact the contributions to the interfacial anisotropy of first order (uniaxial in $\sin^2 \theta$, $\theta$ angle between the magnetisation of the storage layer and the normal to the plane of the layers) and of second order (in $\sin^4 \theta$) of W/CoFeB/MgO multilayers with different thicknesses of CoFeB (Kyoung-Min Lee, Jun Woo Choi, Junghyun Sok, and Byoung-Chul Min, Temperature dependence of the interfacial magnetic anisotropy in W/CoFeB/MgO, AIP Advances 7, 065107 (2017)). The second order contribution is much less than that of the first order and may be neglected. This figure shows that the interfacial anisotropy coming from the CoFeB/MgO interface decreases by around a factor of 2 between 300K (27° C.) and 400K (127° C.) and extrapolates to zero well before reaching 260° C. This indicates strong thermal variations of this interfacial anisotropy as discussed previously in relation with FIG. 2.

FIG. 4 presents the thermal variation of the magnetisation of a bulk material such as cobalt of which the Curie temperature is high: 1394K (curve extracted from Ferromagnetism, Bozorth, Van Nostrand company, Inc.). This curve shows that the thermal variation of the magnetisation of cobalt is less than 4% between 0° C. and 260° C. If the storage layer of the STT-MRAM is a thick layer based on cobalt, the shape anisotropy term $$-\frac{\mu_0}{4}\left(1 - \frac{3}{1 + 4AR/\sqrt{\pi}}\right)M_s^2(T)AL$$

proportional to $M_s^2(T)$ will only vary by 8%, which is much less than the factor of at least 2 of the thermal variation of the interfacial anisotropy.

To reduce the thermal variation of the effective anisotropy, there is thus every interest to reduce the relative weight of the interfacial anisotropy compared to the volume anisotropy in the total anisotropy of the storage layer. This is contrary to perpendicular tunnel junctions of the prior art in which the perpendicular anisotropy stems entirely from the interfacial anisotropy at the MgO/CoFeB interface. Reducing the interfacial anisotropy in the present invention could be achieved in particular by using an alloy rich in cobalt at the level of the interface with the MgO barrier in so far as it is known that the perpendicular anisotropy at the MgO/cobalt interfaces is lower than that at the MgO/Fe interfaces (Yang, H. X., M. Chshiev, B. Dieny, J. H. Lee, A. Manchon, and K. H. Shin, 2011, "First principles investigation of the very large perpendicular magnetic anisotropy at Fe|MgO and Co|MgO interfaces," Phys. Rev. B 84, 054401). Furthermore, since cobalt has a higher Curie temperature than iron, this remaining interfacial anisotropy will vary less with temperature than the interfacial anisotropy at the MgO/Fe interface.

In particular, the energy barrier may be written in a simplified manner by ignoring the volume anisotropy of magnetocrystalline or magnetoelastic origin:

$$E_b(T)=A[K_s(T)+K_v(T)L]$$

where $K_s(T)$ groups together terms of interfacial anisotropy and $K_v(T)$ the volume shape anisotropy proportional to $Ms^2$. As shown in FIGS. 3 and 4, the interface anisotropy decreases in general much quicker with temperature than the volume anisotropy. In order to minimise the thermal variation of the barrier height and thus the writing current over the operating temperature range of the device, it will thus be sought to reinforce the relative importance of the volume shape anisotropy compared to the interface anisotropy.

Typically, according to FIG. 3, the interface anisotropy $K_s$ at the MgO/FeCoB interfaces varies by around 50% for a thermal variation of 100° C. around room temperature. For materials such as Co the variation of $Ms^2$ and thus $K_v$ is only 6%. If it is wished to have a variation of the barrier height $E_b$ and thus of the writing current less than 20%, it is necessary that the proportion X of the shape anisotropy compared to the interface anisotropy is chosen such that 20%>(50%+X*6%)/(1+X) i.e. X>2.14 which can be approximated to 2. If it is wished that this variation is lower than 15%, then it is necessary to increase the proportion of volume anisotropy such that 15%>(50%+X*6%)/(1+X) i.e. X>3.89 which can be approximated by 4.

To summarise, if the shape anisotropy is two times greater than the interface anisotropy, by using a material for the storage layer with high Curie temperature such as an alloy rich in cobalt, the variation of the barrier height and thus of the writing current will be of the order of 20% for a variation of temperature of 100° C. around room temperature.

If the shape anisotropy is four times greater than the interface anisotropy, the variation of the barrier height will be 15%. To the extent that the shape anisotropy would be much greater than the interface anisotropy, this variation could be reduced to values of the order of 6% if the storage layer has a very high Curie temperature such as cobalt.

The possibility of using the perpendicular shape anisotropy to orient the magnetisation of the storage layer out-of-plane and thereby to obtain important values of the thermal stability factor (Δ>60) at small sizes (sub-20 nm) is illustrated in FIG. 5.

This represents the thermal stability factor Δ in colour code as a function of the diameter of the storage layer and its thickness. The parameters chosen to establish this diagram correspond to a cobalt storage layer. STT-MRAMs of the prior art, or p-STT-MRAMs are located in the bottom right hand corner of this diagram. As discussed previously, in this situation of the prior art, the effective anisotropy and thus the thermal stability factor decreases if the thickness of the layer increases. For a minimum thickness of the storage layer of the order of 1.5 nm to have a sufficient tunnel magnetoresistance, the diagram shows that it is not possible to descend below a diameter of the order of 20 nm while keeping a thermal stability factor greater than 60.

Conversely, if one passes into the regime exploited by the present invention where the thickness of the storage layer becomes much greater (upper part of the diagram, PSA-STT-MRAM) then very high values of the thermal stability factor (Δ>60) may be obtained and this is so up to diameters of the order of 4 nm.

The diagram shows the macrospin approximation limit line. Below this limit, it may be considered that the magnetisation of the storage layer reverses in a coherent manner whereas, above this line, the reversal of the magnetisation is rather going to take place with an important deformation of the magnetisation being able to include the nucleation of a reverse domain and the propagation of the magnetic wall separating this reverse domain from the remainder of the layer.

As long as one remains in the region where the macrospin approximation is valid, the relationship $$I_c^0 = \left(\frac{4e}{\hbar}\right)\frac{\alpha E_b}{\eta} = \left(\frac{4e}{\hbar}\right)\frac{\alpha k_B T \Delta}{\eta}$$

remains valid.

This shows a counterintuitive result: even though the thickness of the storage layer is considerably increased compared to STT-MRAMs of the prior art, the writing current will not be increased as long as one remains within the same range of values of the thermal stability factor Δ required by the applications, that is to say typically Δ between 60 and 100 depending on the capacity of the memory and the acceptable error rate.

Conversely, the fact of increasing the thickness of the storage layer has several advantages:

A thick layer has magnetic properties much closer to the bulk material than a very thin layer like the storage layer(s) normally used in p-STT-MRAMs of the prior art (layers of 1.5 nm to 2 nm thickness). In particular, thermal fluctuations develop less quickly as a function of temperature than in a very thin layer. Indeed, it is known that due to the reduced number of neighbouring atoms on the surface of a magnetic layer, the temperature of magnetic order tends to decrease in the ferromagnetic layers of several atomic planes thickness. This means that thermal fluctuations develop in a more important manner in very thin layers than in bulk materials of same composition. In the context of p-STT-MRAMs of the prior art, this results in a rapid decrease in the tunnel magnetoresistance and the magnetic anisotropy as a function of temperature, which is bothersome if the device has to operate over a wide temperature range (−40° C. to +150° C. for automobiles) or must manage to retain the memory during a soldering operation being able to lead to a rise in temperature to 260° C. for one minute (solder reflow compliance). Thus, since the writing current is proportional to $E_b$, the strong variation over the operating range of conventional p-STT-MRAMs leads to a low retention at the upper limit of the operating range and to a strong writing current at the lower limit of the operating range. Thanks to the use of thick magnetic layers as proposed in the present invention, this thermal variation, which resembles much more that of the bulk material, is greatly reduced. Thus, as an example, bulk cobalt only sees its magnetisation vary by several % (~3%) between −40° C. and 150° C. whereas in layers of 1.5 nm thickness, this variation may be 30 to 40%.

A second advantage concerns the Gilbert dampening that intervenes directly in the writing current. As long as one remains in the macrospin region, the Gilbert dampening α that appears in the expression of the writing current is the average Gilbert dampening over the whole volume of the storage layer. Optimisations are then possible to obtain a strong tunnel magnetoresistance and a low average dampening as explained below.

Thus the present invention relates to a tunnel junction with magnetisation perpendicular to the plane of the layers (FIGS. 6A-C) in which the perpendicular anisotropy mainly finds its source in a vertical shape anisotropy obtained by giving to the storage layer a thickness/characteristic planar dimension aspect ratio comprised between 0.8 and 8 and characterised in that the shape anisotropy is positive and greater than the interfacial anisotropy.

Furthermore, the main idea of the present invention, which is to increase the relative weight of the volume anisotropy (which depends slightly on temperature) compared to the interface anisotropy (which depends strongly on temperature), may be combined with the optimisation of the choice of the magnetisation of the main constituent material of the tunnel junction and the thickness of the latter to minimise the effects of dispersion of properties from memory point to memory point during the manufacture of a memory chip, as explained hereafter.

The device according to the invention may also have one or more of the characteristics below, considered individually or according to all technically possible combinations thereof:
   the storage layer comprises an interfacial layer made of an alloy rich in cobalt in contact with the tunnel barrier;
   the storage layer comprises a volume layer having a Curie temperature above 400° C. and preferably above 600° C. and preferably above 800° C.;
   the tunnel junction comprises a single tunnel barrier layer;
   the storage layer includes one or more magnetic materials having a Curie temperature above 400° C. and preferably above 600° C. and preferably above 800° C.;
   the storage layer includes an alloy including cobalt and/or iron and an amorphising element such as boron, said alloy being in contact with the tunnel barrier;
   the storage layer contains one or more layers of materials such as Ta, W, Mo, Hf, able to absorb the amorphising element present in the storage layer and to ensure structural transitions between the different magnetic materials comprised in the storage layer;

the planar section of the magnetic tunnel junction is circular or quasi-circular and the characteristic dimension is the diameter of the section;

the diameter of the magnetic tunnel junction is less than 50 nm;

the tunnel barrier layer is made of MgO, AlOx, AlN, SrTiO$_3$, HfOx or any other insulating oxide or nitride;

the storage layer includes:
  a layer made of alloy of cobalt, iron and amorphising element of thickness between 1 and 4 nm in contact with the tunnel barrier;
  a layer of a material able to absorb boron, such as Ta, Mo, W, Hf at the moment of post-deposition annealings, of 0.2 to 0.4 nm thickness;
  a magnetic layer with low Gilbert dampening;

the magnetic tunnel junction according to the invention has the following properties:
  the magnetic tunnel junction has a stability factor dependent on the energy barrier and the temperature of use of the magnetic tunnel junction;
  the composition and the thickness of the storage layer are chosen such that the absolute value of the derivative of the thermal stability factor compared to a characteristic dimension of a planar section of the tunnel junction is less than 10 nm$^{-1}$, the derivative of the stability factor being calculated at a temperature T$_m$, the temperature T$_m$ being the average temperature of use of the magnetic tunnel junction;

the storage layer is constituted of a homogeneous magnetic material;

the storage layer includes an assembly of magnetic and non-magnetic layers;

the storage layer includes at least one magnetic layer containing an amorphising element such as boron and one or more layers able to absorb the amorphising element during post-deposition annealing;

the storage layer includes at least two magnetic materials, of which a first material close to the tunnel barrier is able to provide a strong tunnel magnetoresistance and a second material has a low Gilbert dampening;

the storage layer is inserted between two tunnel barriers.

The invention also relates to a SOT-MRAM cell including a tunnel junction according to the invention or memory point of STT-MRAM type including a magnetic tunnel junction according to the invention.

The invention also relates to a SOT-MRAM cell including a tunnel junction according to the invention or memory point of SOT-MRAM type including a magnetic tunnel junction according to the invention.

The invention also relates to a MRAM cell with voltage controlled writing including a tunnel junction according to the invention. In other words, a memory point of MRAM type with voltage controlled writing including a magnetic tunnel junction according to the invention.

The invention also relates to a component or non-volatile logic circuit including at least one tunnel junction according to the invention.

The present invention also relates to a method for manufacturing a magnetic tunnel junction in which the thick storage layer is etched by reactive ion etching, this storage layer then serving as hard mask for the etching of the remainder of the tunnel junction by ion etching.

BRIEF DESCRIPTION OF THE FIGURES

Other characteristics and advantages of the invention will become clear from the description that is given thereof below, for indicative purposes and in no way limiting, with reference to the appended figures, among which.

DETAILED DESCRIPTION OF THE INVENTION

Unless stated otherwise, a same element appearing in the different figures has a single reference.

FIGS. 6A-C schematically represents three examples of magnetic tunnel junction PSA-STT-MRAM according to the invention.

According to alternative a), the tunnel junction according to the invention includes a reference layer of fixed out-of-plane magnetisation RL, a tunnel barrier TB and a storage layer SL having a vertical thickness/(characteristic planer dimension) aspect ratio comprised between 0.8 and 8. The reference layer RL has a fixed perpendicular magnetisation represented by a single arrow. The storage layer has a perpendicular magnetisation switchable between two magnetisation states normal to the plane of the layers, represented by a double arrow. In the so-called "top" configuration a), the storage layer SL is above the tunnel barrier TB and the reference layer RL below. In the so-called "bottom" configuration b), the storage layer is below the tunnel barrier TB and the reference layer RL above. For reasons of quality of growth and ease of manufacture, configuration a) is preferable in so far as possible.

Figure 6:
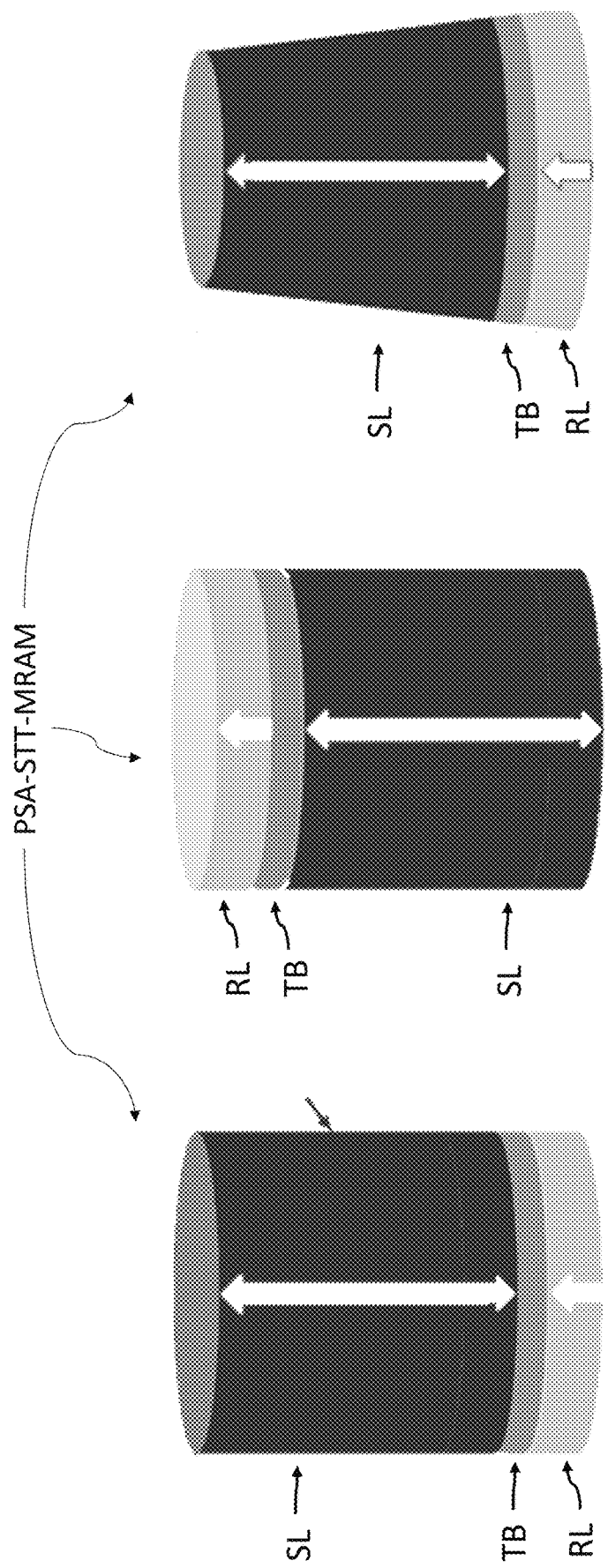
FIGS. 6A-6C: Schematic representation of three examples of a magnetic tunnel junction PSA-STT-MRAM according to the invention.

The configuration of FIG. 6 c) also represents a tunnel junction according to the invention in which the sides of the junction are slightly tapered instead of being virtually vertical. This shape with tapered sides may come from the etching of the junction by ion beach etching (IBE). Even if quantitatively the shape anisotropy of the storage layer SL is modified on account of this truncated cone shape, a vertical shape anisotropy may also be obtained and the other parameters may be adapted to this shape by those skilled in the art according to the present invention.

The ferromagnetic material constituting the storage layer SL and the shape of this layer (thickness and lateral dimension) are chosen such that the shape anisotropy of the storage layer SL is positive and above the interfacial anisotropy existing at the interface with the tunnel barrier. Two configurations may be used. In the so-called "top" configuration a), the storage layer is above the tunnel barrier and the reference layer below. In the so-called "bottom" configuration b), the storage layer is below the tunnel barrier and the reference layer above. For reasons of quality of growth and ease of manufacture, configuration a) is preferable in so far as possible.

Figure 7:
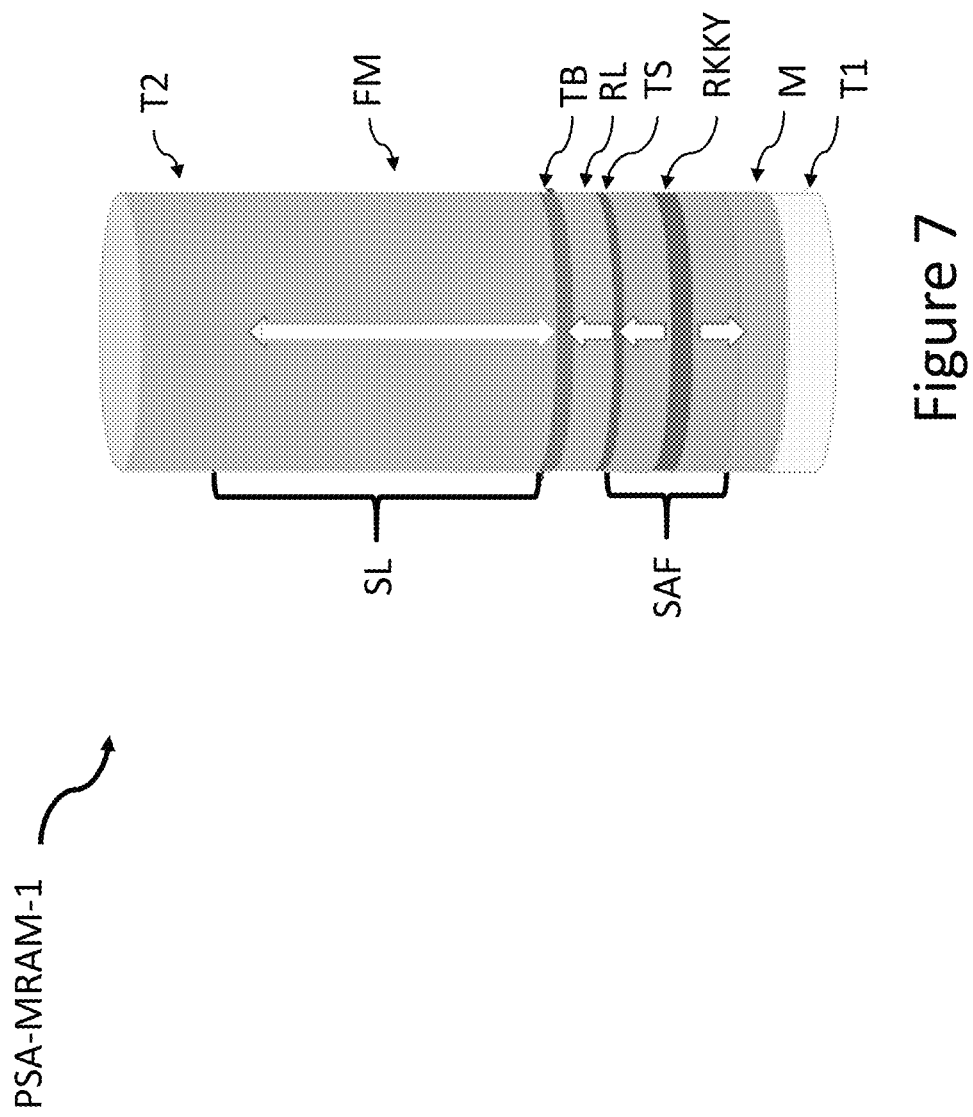
FIG. 7: Schematic representation of the magnetic tunnel junction according to a first embodiment PSA-MRAM-1 of the invention.

FIG. 7 describes a first embodiment of a magnetic tunnel junction according to the invention or PSA-MRAM-1 in which the storage layer SL is composed of a single ferromagnetic layer FM, that is to say constituted of a single homogenous material.

The tunnel junction illustrated in FIG. 7 includes from bottom to top:

a lower electrical contact layer T1,
a metal growth layer M,
a synthetic antiferromagnetic element SAF constituted of two ferromagnetic layers antiferromagnetically coupled through a coupling layer RKKY for example of Ru of 0.3 nm to 0.8 nm thickness,
a structural transition layer TS able to absorb boron, for example made of Ta or W,
a reference layer typically made of CoFeB of 1 to 3 nm thickness,
a tunnel barrier usually made of MgO of between 0.6 and 2 nm thickness,
the storage layer having a vertically elongated aspect ratio, the storage layer being formed of a homogenous material giving a strong tunnel magnetoresistance and preferably with a low Gilbert dampening such as an alloy based on Co, Fe and B. This layer FM is surmounted by a metal layer making it possible to absorb the amorphising element (here B) and also serving as upper electrical contact and optionally as hard mask during the etching of the memory point.

The "bottom" symmetrical configuration is also possible.

Starting from its base, the tunnel junction PSA-MRAM-1 includes on a substrate T1 a seed and growth layer M intended to favour the adherence of the tunnel junction on its substrate and to promote a good growth texture for the remainder of the junction. It next includes a synthetic antiferromagnetic layer SAF well known to those skilled in the art, constituted of two ferromagnetic layers of which the magnetisations are coupled in an antiparallel manner through a thin layer RKKY ensuring an antiparallel coupling between the magnetisations of the ferromagnetic layers. This coupling layer is constituted of a material such as ruthenium or iridium of suitably chosen thickness so that the coupling is antiparallel. For example, for ruthenium, the thicknesses giving antiparallel coupling are typically between 0.3 nm and 0.8 nm. The ferromagnetic layers are constituted of multilayers such as (Co/Pt) or (Co/Pd) or CoPt or CoPd alloys or L10 ordered alloys of FePt or FePd type known to have an out-of-plane magnetic anisotropy. This synthetic antiferromagnetic multilayer SAF is surmounted by a thin nanocrystalline metal layer TS typically made of Ta, Hf, W or Mo having several aims: 1) to ensure a structural transition between the synthetic antiferromagnetic multilayer generally of face centred cubic (fcc) structure of third order symmetry in the favoured growth direction (111) and the layer of CoFeB alloy in contact with the tunnel barrier which is of cubic centred structure thus of fourth order symmetry; 2) to absorb boron or the amorphising element if said element is other than boron (for example Zr, Nb, etc.) outside of the CoFeB layer in contact with the MgO tunnel barrier during the post-deposition annealing necessary for the good crystallisation of the MgO barrier and its electrodes. This layer is sufficiently thin (typically between 0.2 nm and 0.4 nm) to provide strong ferromagnetic coupling between the synthetic antiferromagnetic multilayer and the CoFeB layer.

This structural transition layer TS is itself surmounted by a layer of CoFeB alloy of thickness typically between 1 and 2 nm, which constitutes the reference electrode RL of the tunnel junction. The magnetisation of this layer remains fixed out-of-plane during the operation of the memory.

This layer is surmounted by the MgO tunnel barrier TB of typical thickness of 0.6 to 2 nm. This thickness makes it possible to control the resistance x area (RA) product of the junction. In STT-MRAMs, this RA product is generally chosen between 1 and 10 Ω·μm² so that the tunnel junction has a resistance comparable to that of the selection transistor in ON mode which is connected to the tunnel junction.

The tunnel barrier TB is surmounted by the magnetic storage electrode SL constituted in this first embodiment of a single layer of magnetic material made of alloy based on Co, Fe, Ni and of an amorphising element, preferably boron but other amorphising elements could be used such as Zr or Nb. The thickness of this layer will be chosen between 0.5 and 8 times the targeted diameter for the tunnel junction after nanostructuring. The alloy will be chosen with a Curie temperature above 400° C. and preferably above 600° C. or even 800° C. so that the variation of its magnetisation over the range −40° C. to 260° C. is not too important. One way of increasing the Curie temperature of the alloy is to increase its concentration of cobalt of which the Curie temperature is 1121° C. However, the Gilbert dampening depends on the concentration of the alloy, being minimum towards concentrations where iron is in proportion 3 times greater than cobalt (Ultra-low magnetic damping of a metallic ferromagnet, Martin A. W. Schoen Danny Thonig, Michael L. Schneider, T. J. Silva, Hans T. Nembach, Olle Eriksson, Olof Karis and Justin M. Shaw, Nat. Phys. 12, 839 (2016)). Since the Gilbert dampening has a direct influence on the writing current, it will be necessary to choose the concentration of the alloy both as a function of the need to minimise the thermal variation and the tolerance on the value of the writing current.

This ferromagnetic layer is surmounted by one or more metal layers T2. A first aim of this metal layer is to absorb the amorphising element outside of the magnetic storage electrode during the post-deposition annealing necessary for the good crystallisation of the tunnel barrier and the magnetic electrodes. This layer able to absorb the amorphising element may be made of tantalum (Ta), tungsten (W), molybdenum (Mo), hafnium (Hf), etc.

Optionally, several laminations of this layer able to absorb boron or the amorphising element may be introduced into the thickness of the ferromagnetic storage layer to improve the re-crystallisation of the alloy. For example a CoFeB layer of 16 nm surmounted by a Mo layer of 4 nm could be replaced by a (CoFeB 4 nm/Mo 2 nm)$_4$/Mo multilayer of 2 nm.

The ferromagnetic storage layer SL may also be surmounted by a second oxide layer (second tunnel barrier) intended to reinforce the perpendicular anisotropy of the storage layer. In this case, in addition to the shape anisotropy of the storage layer, this also benefits from the interface anisotropy not only at the interface with the tunnel barrier but also at the interface with this second oxide layer. It is then necessary to see to it that one or more layers able to absorb the amorphising element of the storage layer are inserted into the storage layer as described previously. As is known to those skilled in the art, the second tunnel barrier must have a sufficiently low resistance*area product compared to the first tunnel barrier that provides the tunnel magnetoresistance signal so as not to too reduce this signal due to the resistance in series associated with this second tunnel barrier. Other functions of the upper metal layer(s) T2 are to enable an electrical contact at the summit of the structure and optionally to serve as hard mask for etching during the etching of the tunnel junction.

The structure described in FIG. 7 is presented in "top" configuration. It goes without saying that the "bottom" configuration may also be produced by reversing the stack, that is to say with the storage layer under the tunnel barrier and the reference layer made of the SAF layer above the barrier.

Figure 8:
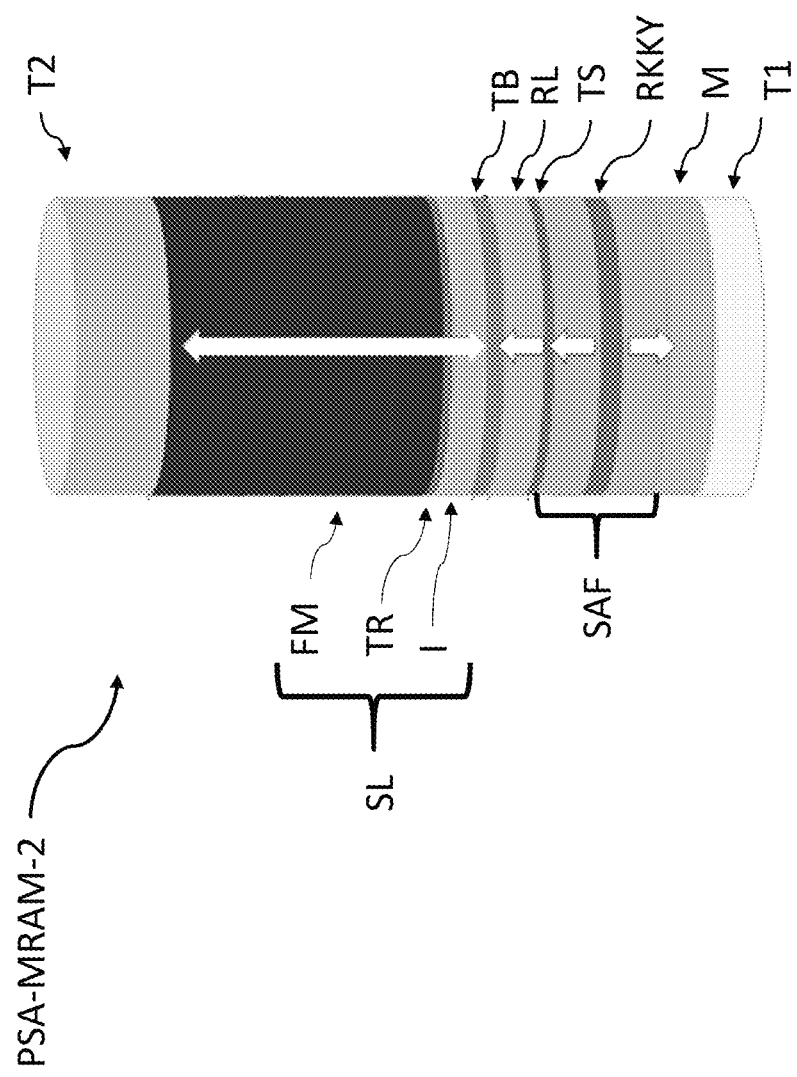
FIG. 8: Schematic representation of the magnetic tunnel junction according to a second embodiment PSA-MRAM-2 of the invention.

FIG. 8 illustrates a magnetic tunnel junction PSA-MRAM-2 according to a second embodiment of the invention.

The magnetic junction tunnel PSA-MRAM-2 according to the invention includes from bottom to top:
 a lower electrical contact layer T1;
 a metal growth layer M;
 a synthetic antiferromagnetic SAF constituted of two ferromagnetic layers antiferromagnetically coupled through a coupling layer RKKY for example Ru of 0.3 nm to 0.8 nm thickness;
 a structural transition layer TS able to absorb boron for example made of Ta or W;
 a reference layer RL typically made of CoFeB;
 a tunnel barrier TB usually made of MgO;
 a storage layer SL having a vertically elongated aspect ratio, the storage layer being formed of an interfacial part I for example made of FeCoB, a thin transition layer TR, for example made of Ta or W or Mo, and a thick ferromagnetic layer FM;
 a metal layer T2 serving as upper electrical contact and optionally as hard mask during the etching of the memory point.

The "bottom" symmetrical configuration is also possible.

In the embodiment described in FIG. 8, the storage layer SL, instead of being constituted of a homogenous material, is constituted of an assembly of magnetic and non-magnetic layers. In particular, if the tunnel barrier is made of MgO as is most often the case, it is advantageous to conserve near to the interface with the tunnel barrier TB a layer I of CoFeB alloys preferably rich in cobalt to reduce the interfacial anisotropy, of 1.5 to 3 nm thickness, making it possible to obtain a strong tunnel magnetoresistance. As non-limiting example of alloys rich in Co may be cited:
 $Co_{80}B_{20}$;
 $Co_{72}Fe_8B_{20}$;
 $Co_{56}Fe_{24}B_{20}$;
 or more generally: $(Co_xFe_{(1-x)})_{(1-y)}B_y$ with x comprised between 0.5 and 1 and y comprised between 0 and 0.40, boron being able to be substituted all or part by another amorphising element (for example Zr, Nb, V) and Fe being able to be partially substituted by nickel.

This thin magnetic layer may be associated with a thick layer of NiFe or alloys based on Co, Fe, Ni and optionally other additives (V, Al, Mo, etc.) having a low Gilbert dampening. This layer is noted FM. Advantageously, the two magnetic layers are separated by a non-magnetic layer TR for example of Mo, W, Hf or Ta of 0.2 to 0.4 nm thickness making it possible to absorb boron from the CoFeB layer during the post-deposition annealing necessary for the good crystallisation of the MgO barrier and the CoFeB electrodes, as is known in STT-MRAMs of the prior art.

In the second embodiment described in FIG. 8, the thick ferromagnetic storage layer SL includes at least two different magnetic materials. The first magnetic material in contact with the tunnel barrier makes it possible to obtain a strong tunnel magnetoresistance. Strong tunnel magnetoresistance is taken to mean a magnetoresistance at least above 100%. As in conventional p-STT-MRAMs, this interfacial layer I will be preferentially made of alloy based on Co, Fe and B or other amorphising element. Since in the present invention it is sought to reduce the relative role of the interface anisotropy, an interfacial alloy rich in cobalt will preferably be chosen here because it is known that the anisotropy at the Co/MgO interface is lower than at the Fe/MgO interface.

As non-limiting examples of alloys rich in Co may be cited:

$Co_{80}B_{20}$;

$Co_{72}Fe_8B_{20}$;

$Co_{56}Fe_{24}B_{20}$;

or more generally: $(Co_xFe_{(1-x)})_{(1-y)}B_y$ with x comprised between 0.5 and 1 and y comprised between 0 and 0.40, boron being able to be substituted all or part by another amorphising element (for example Zr, Nb, V) and Fe being able to be partially substituted by nickel.

A second magnetic material FM is then deposited in the part of the storage layer further away from the tunnel barrier. This second material is chosen to have a low Gilbert dampening $\alpha$. Low Gilbert dampening is taken to mean a dampening less than 0.02. Indeed, the current necessary for writing by STT being proportional to the Gilbert dampening averaged over the whole volume of the layer, it is preferable to minimise this average dampening. Materials with low Gilbert dampening are Permalloy ($Ni_{80}Fe_{20}$), CoFe alloys of concentration close to $Co_{25}Fe_{75}$, Heusler alloys. These two magnetic materials being able to have different crystallographic structures, a structural transition layer TS able to absorb the amorphising element during post-deposition annealing could be introduced between the two layers of the two magnetic materials as represented in FIG. 8. Thanks to this choice of material at the interface with the tunnel barrier TB and in the volume of the storage layer SL, it will be sought that the shape anisotropy is at least 2 times greater and preferably 4 times greater than the interface anisotropy to reduce the temperature dependency of the total anisotropy.

The other constituent layers of the stack are similar to those discussed for the first embodiment of FIG. 7.

Figure 9:
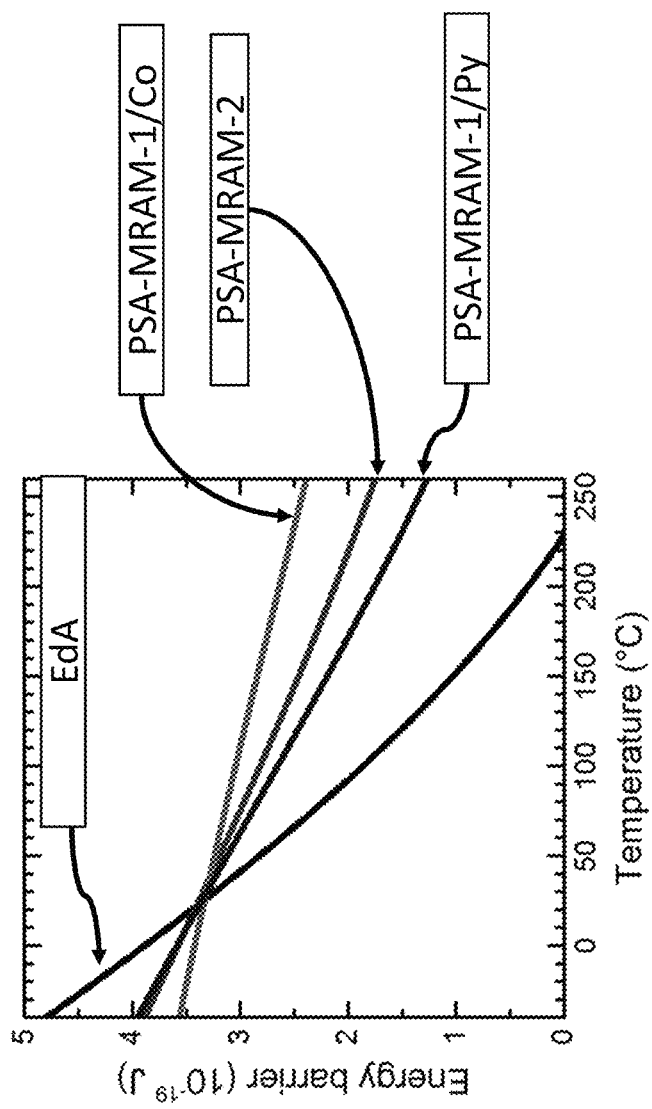
FIG. 9: Energy barrier as a function of temperature between −40 and +260° C. for 4 different MRAMs: FeCoB (1.2 nm) with D=31 nm, FeCoB (1.4 nm)/Co (12 nm) with D=12.8 nm, Co (16.6 nm) with D=11.4 nm and Py (26.8 nm) with D=19 nm.

FIG. 9 illustrates the thermal variation of the thermal stability factor in tunnel junctions of the prior art and in those according to the present invention.

FIG. 9 shows the thermal variation of the barrier height $E_b$ which determines the value of the thermal stability factor $\Delta=E_b/k_BT$, for different types of storage layers according to the first embodiment (storage layer entirely made of Co, PSA-MRAM-1/Co, or entirely made of NiFe, PSA-MRAM-1/Py), for the second embodiment (Interfacial FeCoB layer associated with a thick volume layer made of cobalt, PSA-MRAM-2) and for a storage layer according to the prior art (EdA).

The benefit obtained from this invention in terms of thermal variation of the thermal stability factor is clearly shown in FIG. 9.

In the paragraph below, the thermal variations of thermal stability factors illustrated in FIG. 9 are compared on the basis of modelling for different compositions of storage layers in accordance with the first or second embodiments and for a storage layer in accordance with the prior art.

In this comparison, the variation of magnetisation as a function of temperature is described by:

$$M_S(T) = M_S(0)\left[1 - \left(\frac{T}{T_c}\right)^{\frac{3}{2}}\right]$$

where $M_S(0)$ is the magnetisation at 0 K. The variation of anisotropy is given by:

$$K(T) = K(0)\left(1 - b\frac{T}{T_c}\right)\left[\frac{M_S(T)}{M_S(0)}\right]^3$$

where $K(0)$ is the anisotropy at 0 K. The term b represents a thermal expansion coefficient, useful for taking account of the expansion of the crystalline lattice of the thin layers. Thus, $b=0$ will be taken for the thick layers (L>5 nm) and $b=0.4$ for the thin layers (L<5 nm). When the storage layer is composed of several ferromagnetic layers coupled together, a property X ($X=M_S$, $K_S$, $K_u$, $\alpha$) of the layer as a whole is given by:

$$\begin{cases} L = \sum_i L^i \\ X = \sum_i X^i \frac{L^i}{L} \end{cases}$$

where the index i refers to the layer i. In addition, the following numerical values have been used:

$M_S^{Co}(0)=1.6 \cdot 10^6$ A/m, magnetisation at 0 K of bulk Co.

$M_S^{FeCoB}(0)=1.6 \cdot 10^6$ A/m, magnetisation at 0 K of the FeCoB thin layer.

$M_S^{Py}(0)=0.9 \cdot 10^6$ A/m, magnetisation at 0 K of bulk Permalloy (Py).

$K_S^{FeCoB}(0)=3$ mJ/m², anisotropy at 0 K of the MgO/FeCoB thin layer.

$T_c^{FeCoB}=1100$ K, Curie temperature of the FeCoB thin layer.

$T_c^{Co}=1388$ K, Curie temperature of bulk Co.

$T_c^{Py}=826$ K, Curie temperature of Permalloy.

The thermal variations of the barrier height have been studied between −40° C. and +260° C. to cover both the field of automobile applications and also the question of memory retention at the moment of soldering the chip (solder reflow compliance). In this comparison, the diameter and thickness values are chosen such that each device has a thermal stability $\Delta=80$ at 300 K.

The prior art EdA corresponds to the FeCoB stack (1.2 nm) with D=60 nm. It is observed that, in these conditions, the perpendicular anisotropy varies extremely rapidly and that in particular it is no longer maintained above ~230° C.

The two cases of the first embodiment PSA-MRAM-1/Co and PSA-MRAM-1/Py correspond respectively to the stacks Co(16.6 nm) with D=11.4 nm and Py (26.8 nm) with D=19 nm. In these cases, the anisotropy varies much more slowly compared to the prior art, in particular in the case of Co which has a very high Curie temperature (1121° C.).

The case of the second embodiment PSA-MRAM-2 corresponds to the FeCoB (1.4 nm)/Co (12 nm) stack with D=12.8 nm. The dependency of its anisotropy is logically comprised between that of pure Co and that of the prior art since it involves a mix between the two technologies.

The PSA-MRAMs described in the present application thus have a dependency on their anisotropy as a function of temperature much lower than that of the prior art. In order to minimise this dependency, it is preferable to use the second embodiment and to choose for the volume part of the storage layer materials with high Curie temperature such as iron or cobalt or alloys containing a large proportion of these materials, in particular cobalt while seeing to it that the Gilbert dampening of the material chosen is not too great, that is to say remains typically less than 0.02. As regards the interfacial material of the storage layer in contact with the tunnel barrier, an interfacial material will be chosen having a low surface anisotropy since surface anisotropy varies more rapidly with temperature than shape anisotropy. This can be done with alloys based on Co and iron and amorphising element such as boron, rich in Co because the anisotropy at the oxide/cobalt interface is lower than at the oxide/Fe interface.

As non-limiting examples of alloys rich in Co may be cited:

$Co_{80}B_{20}$;
$Co_{72}Fe_8B_{20}$;
$Co_{56}Fe_{24}B_{20}$;

or more generally: $(Co_xFe_{(1-x)})_{(1-y)}B_y$ with x comprised between 0.5 and 1 and y comprised between 0 and 0.40, boron being able to be substituted all or part by another amorphising element (for example Zr, Nb, V) and Fe being able to be partially substituted by nickel.

This interfacial alloy will be chosen to provide a strong amplitude of TMR as is the case with CoFeB alloys. As described previously, these two magnetic materials could be separated by a thin layer of material such as Ta, W or Mo, able to absorb the amorphising element and to ensure a structural transition between the two materials. Optionally, the storage layer may contain several laminations of such a material able to absorb the amorphising element.

In the case where the storage layer is inserted between two tunnel barriers, then the storage layer could be divided into 3 parts, a first interfacial magnetic layer in contact with the first barrier of same nature as described above in the case of a single barrier, surmounted by a second magnetic volume layer of same nature as described above in the case of a single tunnel barrier, surmounted by a second interfacial magnetic layer in contact with the second tunnel barrier, it also having low interface anisotropy. These different magnetic layers could be separated by several layers of material such as Ta, W or Mo, able to absorb the amorphising element and to ensure a structural transition from one material to the other. It should be noted that the use of two tunnel barriers here has a limited interest in so far as the second tunnel barrier used in the prior art serves to increase the perpendicular anisotropy of interfacial origin thanks to the presence of two oxide/magnetic metal interfaces whereas, in the present invention, it is sought on the contrary to reduce the contribution of the interfaces to the total anisotropy. In the present invention, it will thus be in general preferable to be limited to a single tunnel barrier.

In a third embodiment, the magnetic tunnel junction according to the invention is integrated in a SOT-MRAM cell.

Figure 10A:
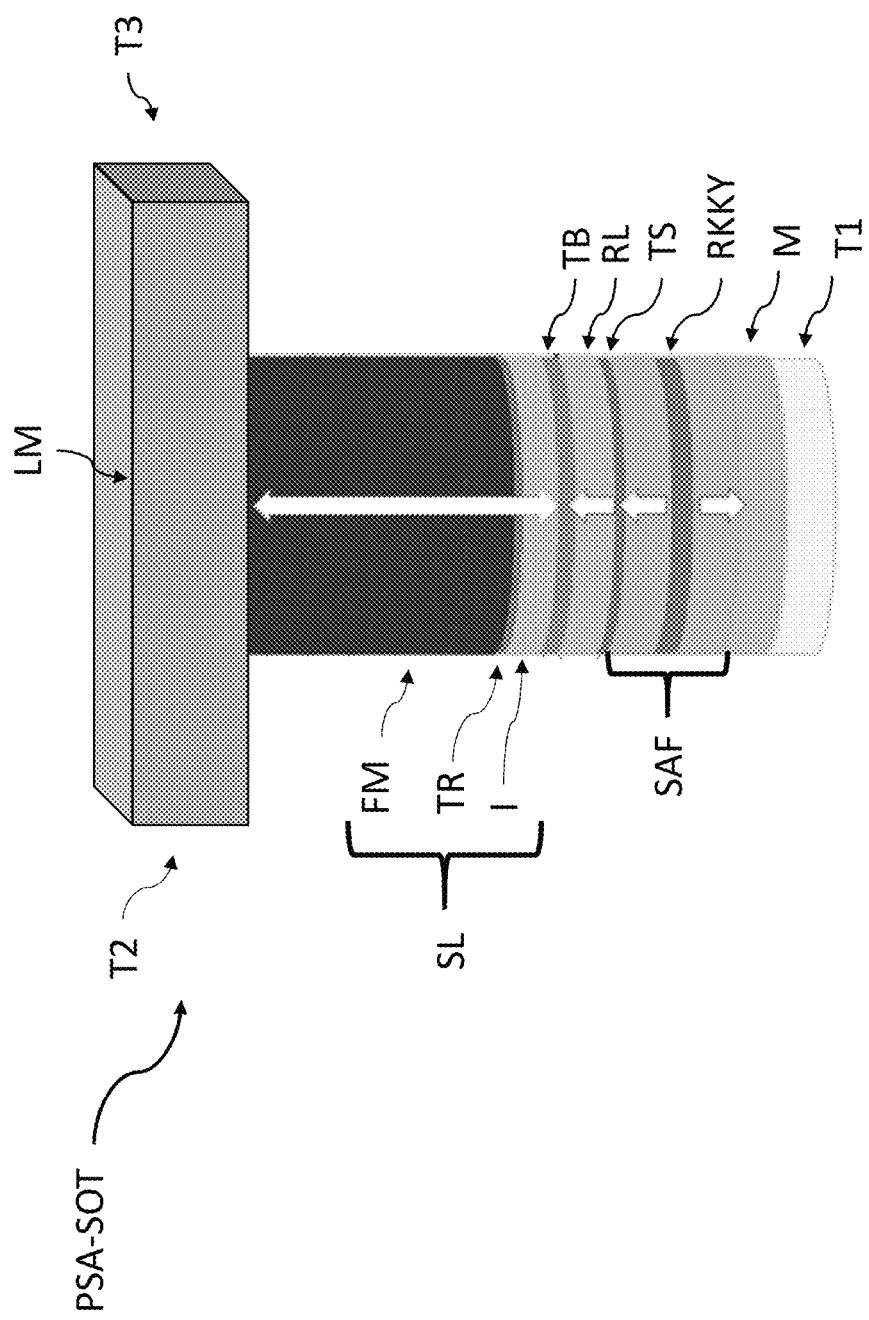
FIGS. 10A-10B: Implementation of the tunnel junction according to the invention in a cSOT-MRAM memory cell; a) "Top" configuration; b) "Bottom" configuration.
Figure 10B:
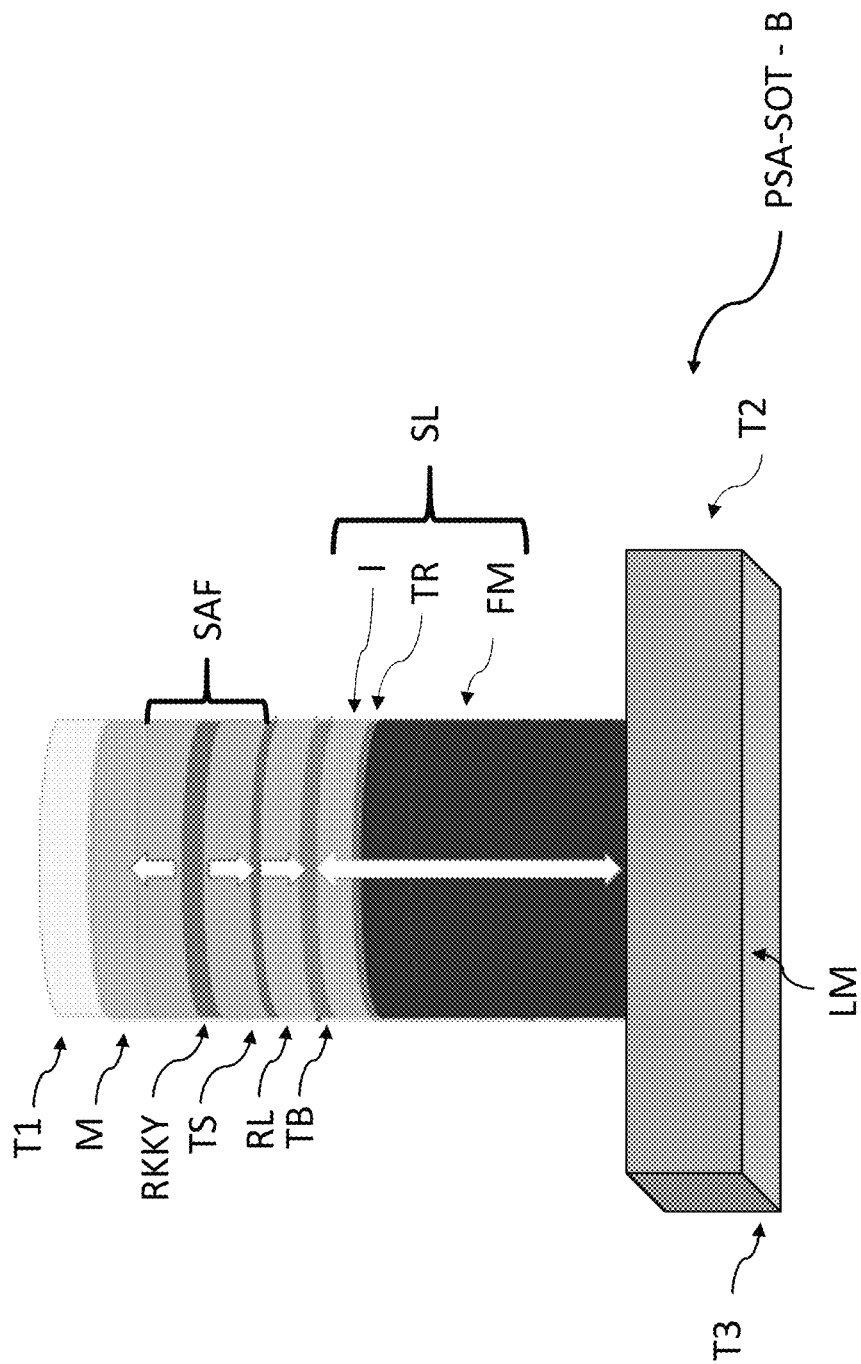

The device may be produced in "top" configuration, illustrated in FIG. 10a or "bottom" configuration, illustrated in FIG. 10b.

The magnetic junction PSA-SOT according to the invention illustrated in FIG. 10a includes from bottom to top:
  a lower electrical contact layer or terminal T1,
  a metal growth layer M,
  a synthetic antiferromagnetic layer SAF constituted of two ferromagnetic layers antiferromagnetically coupled through a coupling layer RKKY for example of Ru of 0.3 nm to 0.8 nm thickness,
  a structural transition layer TS able to absorb boron for example made of Ta or W,
  a reference layer RL typically made of CoFeB,
  a tunnel barrier TB usually made of MgO,
  a storage layer SL having a vertically elongated aspect ratio, the storage layer being formed of an interfacial part I for example made of FeCoB, a thin transition layer TR, for example made of Ta or W or Mo, and a thick ferromagnetic layer FM.

A metal line LM parallel to the plane of the layers and in contact with the storage layer SL and comprising a second electrical contact or terminal T2 and a third electrical contact or terminal T3. As is known to those skilled in the art, SOT-MRAM cells have 3 terminals, T1, T2 and T3. During writing, the magnetisation of the storage layer SL is switched by making a current pulse circulate in a conductive line LM parallel to the plane of the layers. The material of the conductive line LM is chosen to have a high spin Hall angle. This line may be for example made of non-magnetic metal such as Pt, Ta, W, Ir or made of antiferromagnetic metal such as IrMn or PtMn or other heavy material with high spin orbit. A spin orbit effect called spin Hall effect taking place in this conductive line LM makes it possible to inject a spin polarised current into the storage layer SL. This spin current makes it possible to switch the magnetisation of the storage layer SL. As is known to those skilled in the art, when the magnetisation of the storage layer SL is out-of-plane, it is necessary to apply a static longitudinal field (substantially parallel to the conductive line) to make the switching deterministic. This field may be created by inserting at the base or at the summit of the stack a layer of hard material radiating a static field on the storage layer or by using the exchange anisotropy field produced at the interface between the storage layer and the conductive line of heavy metal when it is antiferromagnetic as described in the article: S. Fukami, C. Zhang, S. Dutta Gupta, A. Kurenkov and H. Ohno, Magnetization switching by spin-orbit torque in an antiferromagnet-ferromagnet bilayer system, Nat. Mat. 15, 535 (2017).

The device may be produced in top (FIG. 10a) or bottom (FIG. 10b) configuration.

Figure 11:
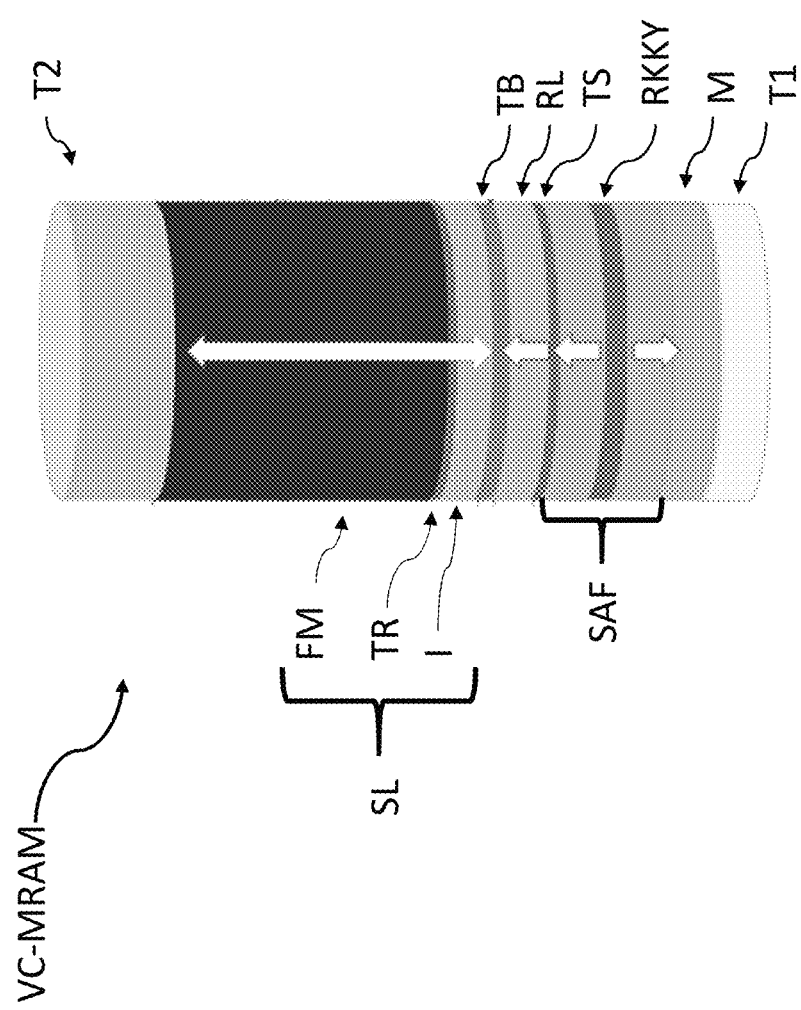
FIG. 11: Implementation of the junction according to the invention in a voltage controlled MRAM (VC-MRAM). The bottom configuration is also possible.

In a fourth embodiment, the magnetic tunnel junction is used in a MRAM cell with voltage controlled writing. Such a tunnel junction with electric voltage controlled writing VC-MRAM is illustrated in FIG. 11.

The tunnel junction with electric voltage controlled writing VC-MRAM according to the invention includes from bottom to top:
  a lower electrical contact layer T1,
  a metal growth layer M,
  a synthetic antiferromagnetic layer SAF constituted of two ferromagnetic layers antiferromagnetically coupled through a coupling layer RKKY for example of Ru of 0.3 nm to 0.8 nm thickness,
  a structural transition layer TS able to absorb boron for example made of Ta or W,
  a reference layer RL typically made of CoFeB,
  a tunnel barrier TB usually made of MgO,
  a storage layer SL having a vertically elongated aspect ratio, the storage layer being formed of an interfacial part I for example made of FeCoB, a thin transition layer TR, for example made of Ta or W or Mo, and a thick ferromagnetic layer FM.
  a metal layer T2 serving as upper electrical contact and optionally as hard mask during the etching of the memory point. The symmetrical "bottom" configuration is also possible.

As is known to those skilled in the art, the magnetic properties of certain magnetic materials may be controlled by electrical field. In particular, the interfacial anisotropy at the oxide/magnetic metal interface may be modulated by the application of an electrical field through the oxide as described for example in: Induction of coherent magnetization switching in a few atomic layers of FeCo using voltage pulses, Y. Shiota, T. Nozaki, F. Bonell, S. Murakami, T. Shinjo, and Y. Suzuki, Nature Materials 11, 39 (2012). Also, the volume properties of multiferroic magnetic materials may be modulated by electrical field. Thus the storage layer may be conceived by playing on the modulation of the interface anisotropy, either by playing on the modulation of one volume magnetisation, or both, such that the application of a voltage to the terminals of the tunnel junction modifies the anisotropy from out-of-plane to in-plane initiating a rotation of the magnetisation from out-of-plane to in-plane. Given the processional movement induced by this initial rotation, by controlling the duration of the voltage pulse so that it is of the order of half the precession period, it is possible to switch the magnetisation from the "upwards" direction to the "downwards" direction or vice versa. The reading is carried out under lower voltage making it possible to measure the magnetic state of the junction by the tunnel magnetoresistance, the voltage being sufficiently low so as not to perturb the magnetic state of the junction. Such a tunnel junction with electric voltage controlled writing is illustrated in FIG. 11. Generally speaking, these junctions have a barrier thickness slightly greater than in junctions with spin transfer writing to minimise the current circulating through the barrier during writing.

Figure 12:
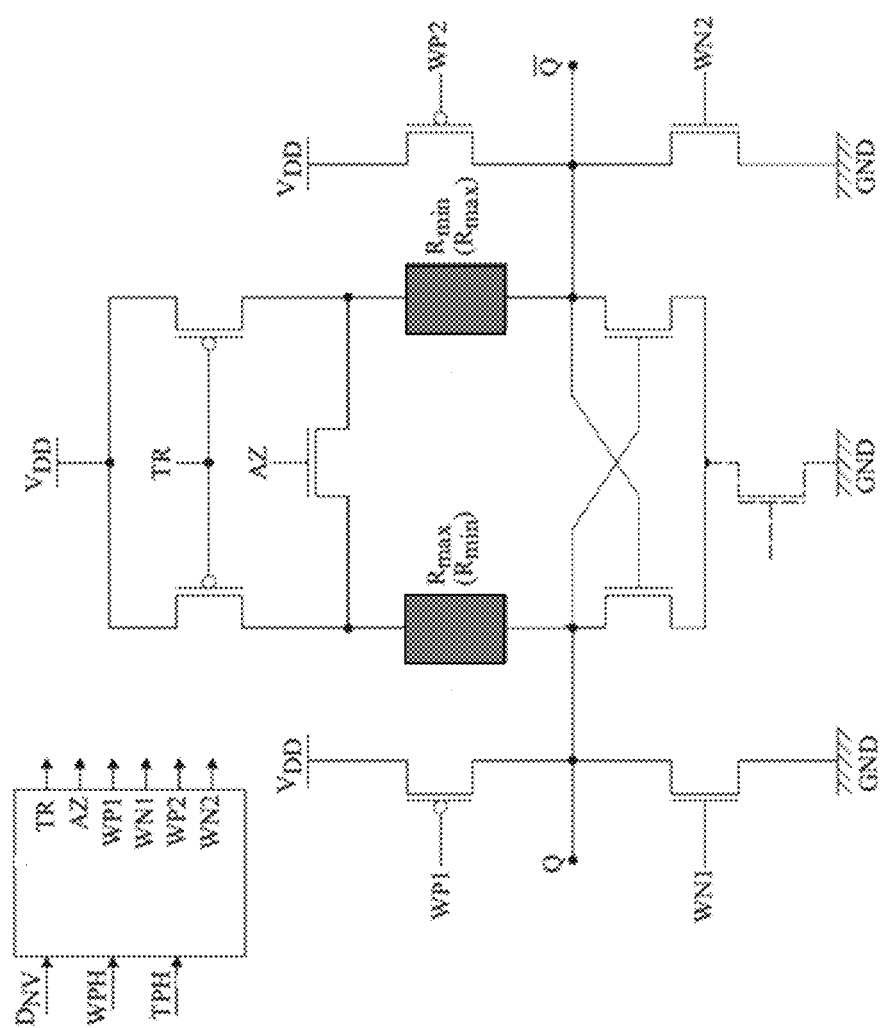
FIG. 12: Example of non-volatile logic component using tunnel junctions according to the invention. Here a non-volatile latch.

In a fifth embodiment, illustrated in FIG. 12, the junction according to the invention is inserted as non-volatile element into a logic component of different possible natures. Different components and non-volatile logic circuits have been proposed over the last few years based on conventional tunnel junctions using very thin storage layers (1 to 3 nm thickness). These same components and circuits may be produced by substituting these tunnel junctions of the prior art by the tunnel junctions according to the invention. As an example, FIG. 12 shows a non-volatile latch including two magnetic tunnel junctions according to the invention, represented in blue. This circuit is adapted from the patent application US2015/0036415 A1.

Figure 13:
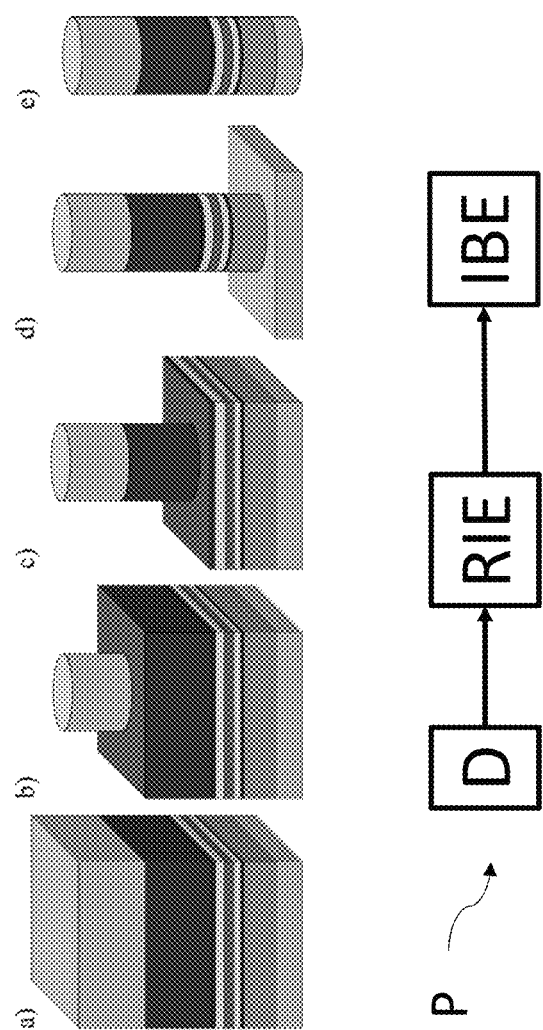
FIG. 13: Method for manufacturing a tunnel junction according to the invention.
Figure 14B:
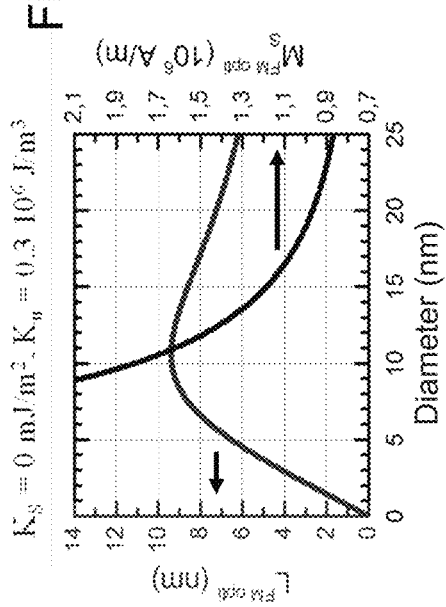
FIG. 14B: Identical to FIG. 14A with the sole exception that the magnetocrystalline anisotropy is equal to K$_u^{FM}$=0.3 10$^6$ J/m$^3$.
Figure 14D:
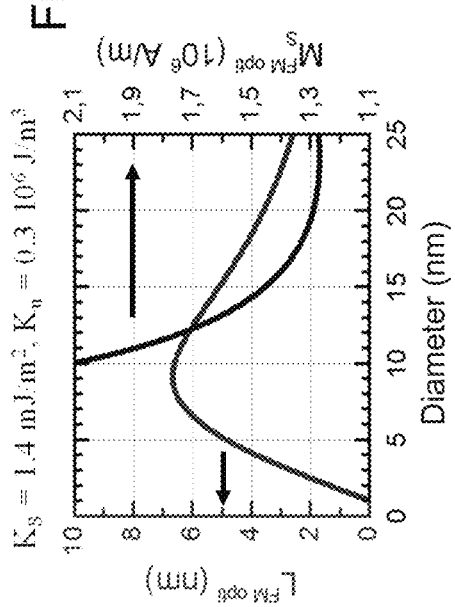
FIG. 14D: Identical to FIG. 14C with the sole exception that the magnetocrystalline anisotropy is equal to K$_u^{FM}$=0.3 10$^6$ J/m$^3$.
Figure 14A:
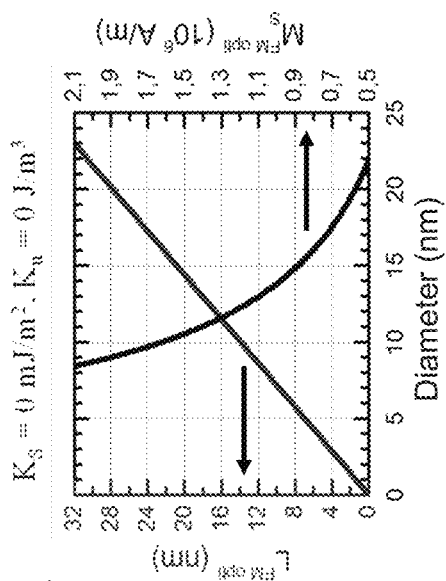
FIG. 14A: Graphs of M$_S^{FM\ opti}$ and t$^{FM\ opti}$ calculated for a magnetocrystalline anisotropy of K$_u^{FM}$=0; these curves correspond to the monolayer stack FM, for a stability Δ$_{300}$=60.
Figure 14C:
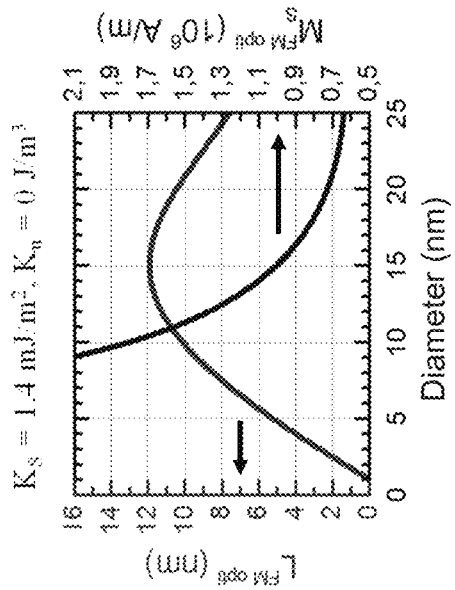
FIG. 14C: Graphs of M$_S^{FM\ opti}$ (right vertical scale) and t$^{FM\ opti}$ (left vertical scale) calculated for a magnetocrystalline anisotropy of K$_u^{FM}$=0. These curves correspond to the FeCoB/FM stack with M$_S^{FeCoB}$=1.0 10$^6$ A/m, t$^{FeCoB}$=1.4 nm and K$_S^{FeCoB}$=1.4 mJ/m$^2$, for a stability Δ$_{300}$=60.

FIG. 13 describes a method P for manufacturing the tunnel junction PSA-MRAM-1 or PSA-MRAM-2 according to the invention.

In particular, FIG. 13 illustrates: (a) deposition of all of the constituent layers of the stack, (b) reactive ion etching of the upper electrode, (c) ion etching of the thick layer FM belonging to the storage layer, (d) ion etching of the remainder of the tunnel junction and (e) reactive ion etching of the lower electrode; The method P according to the invention includes the following steps:

Deposition D of all of the layers by physical vapour deposition;
Etching RIE of the storage layer or thick magnetic layer by reactive ion etching;
Etching IBE of the other layers by ion beam etching.

After deposition of all of the layers by a physical vapour deposition (PVD) method such as cathodic sputtering, a hard mask is defined by lithography and etching on the surface of the stack. The layer constituting the hard mask may for example be made of tantalum, which is easily etched by reactive ion etching.

Next, advantageously, it will be sought to etch the thick magnetic layer by reactive ion etching. Several articles describe means for etching Permalloy or cobalt by reactive ion etching using reactive gases based on methanol or carbon monoxide potentially combined with argon (Development of methanol based reactive ion etching process for nanoscale magnetic devices, M. T. Moneck and J. G. Zhu, NSTI-Nanotech 2011). Since this magnetic layer is thick, it is particularly advantageous to try etching by reactive ion etching to avoid a lot of deposition of this etched magnetic material. If the thick magnetic layer is constituted of several magnetic elements, it is then possible to etch by reactive ion etching at least the thickest of the two.

Next the remainder of the structure may be etched by ion beach etching (IBE) in so far as the layers in play are much thinner. This method is compatible with high memory point densities (technological node <10 nm) since the etching of the junction is almost entirely carried out by RIE and that the storage layer may itself be constituted of a thick hard mask for the etching of the lower part of the stack.

Minimisation of the Variability

The invention also relates to a magnetic tunnel junction having a stability factor dependent on the energy barrier and the temperature of use of the magnetic tunnel junction in which the composition and the thickness of the storage layer are chosen such that the absolute value of the derivative of the thermal stability factor compared to a characteristic dimension of a planar section of the tunnel junction is less than 10 nm$^{-1}$, the derivative of the stability factor being calculated at a temperature $T_m$, the temperature $T_m$ being the average temperature of use of the magnetic tunnel junction.

Advantageously, such a choice of the parameters of the magnetic tunnel junction makes it possible to reduce variability from memory point to memory point of the anisotropy and of the writing current over a wide operating temperature range.

An example of temperature range is −40° C. to +150° C. for automobile applications. Energy barrier separating the two magnetisation states of the storage layer is taken to mean the difference in energy between the minimum energy corresponding to the initial stable state of the magnetisation of the storage layer and the maximum energy encountered during the reversal of the magnetisation to the final stable state.

Thermal stability factor is taken to mean a measurement of the stability of the magnetisation of the storage layer for a given energy barrier and temperature.

For example, the thermal stability factor may be expressed as $\Delta = E_b/K_B T$, $E_b$ being the energy barrier, T the temperature and $K_B$ Boltzmann's constant.

Planar section of the tunnel junction is taken to mean a section of the tunnel junction along the plane of the layers forming the tunnel junction.

Characteristic dimension of a planar section is taken to mean a dimension of said planar section. For example, in the case of tunnel junction having a circular section, the characteristic dimension of a planar section of the tunnel junction may be chosen as being the diameter of the circle. In the case of elliptical section, the characteristic dimension may be chosen as being the small axis or the large axis of the ellipse.

Hereafter "characteristic dimension of a planar section" and "characteristic planar dimension" are synonymous.

Choice of the composition of the storage layer is taken to mean the choice of at least one of the materials comprised in the storage layer.

Thickness of the storage layer is taken to mean the size of the storage layer measured along a direction normal to the plane of the layers.

An important point of this embodiment concerns the optimisation of the choice of the thickness and magnetic parameters of the storage layer to minimise the effects of dispersion of properties from memory point to memory point during the manufacture of a memory chip. Among the following parameters: diameter, thickness, magnetisation at saturation, interface anisotropy and volume anisotropy, mainly the diameter is capable of varying significantly from memory point to memory point on account of the method of etching or nanostructuring the memory points. Indeed, all the other parameters are chosen upstream of the etching of the junctions and are not affected by the latter. The deposition techniques of those skilled in the art are perfectly mastered and do not induce significant spatial variations of its properties within a chip. On the other hand, during the etching of the tunnel junctions, it is inevitable that variations of diameter appear from one junction to the next. These variations of diameter may typically be of the order of 1 to several nanometres. Since the total effective anisotropy mainly or entirely draws its source from the shape anisotropy term, that is to say linked to the very shape of the storage layer, it is inevitable that variations of diameter induce variations of thermal stability, and consequently variations of writing current. In order to minimise the effect of the diameter variations on the stability, it is necessary to be positioned at the point defined by min $$\left(\left|\frac{\partial \Delta}{\partial D}\right|\right)$$

where min(*) represents the minimum function and |*| the absolute function value. In particular, when this is possible, it is necessary to be positioned at the point defined by $$\frac{\partial \Delta}{\partial D} = 0.$$

Figure 15:
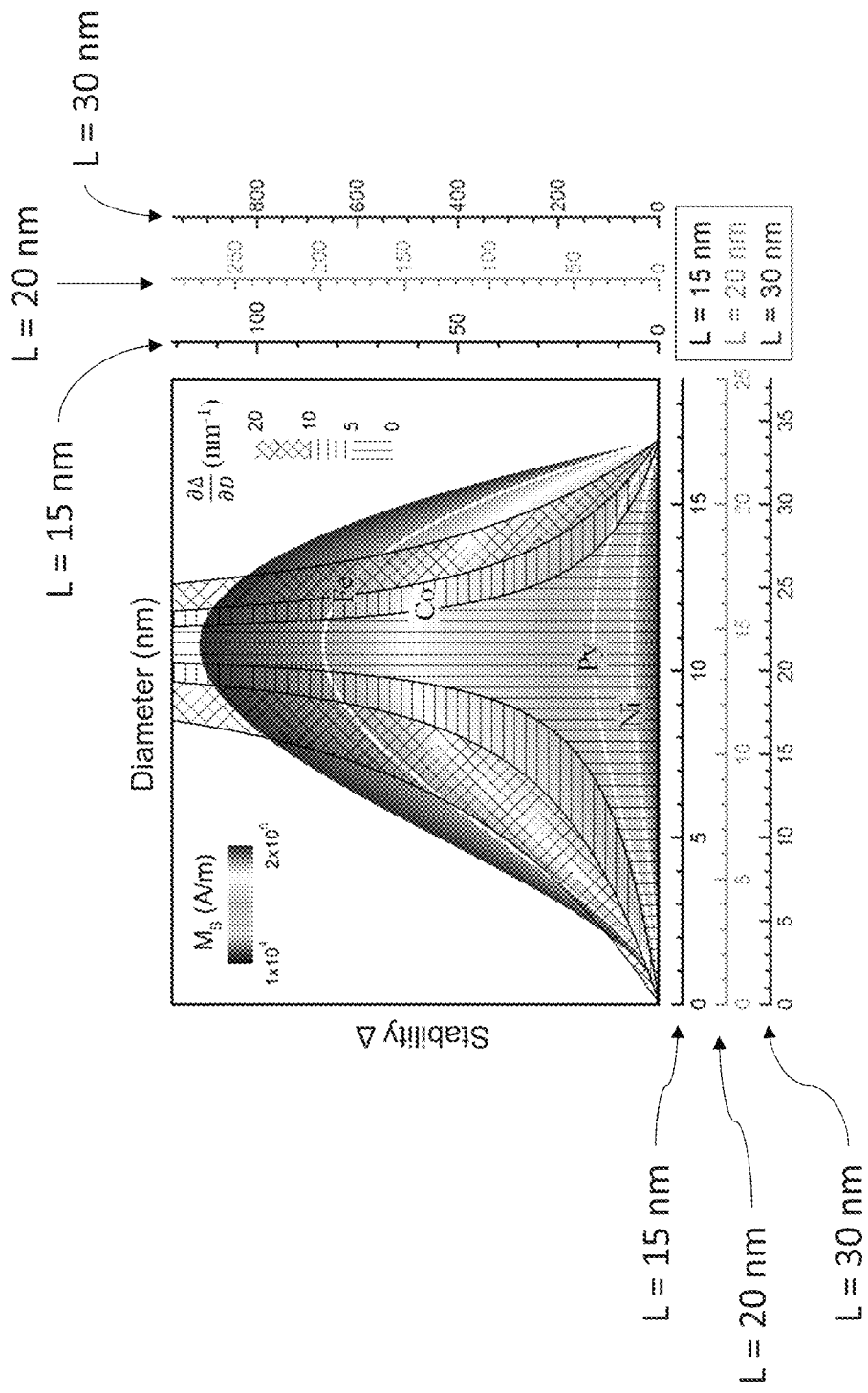
FIG. 15: Representation of Δ as a function of diameter for all M$_S$ (colour code) and for different thicknesses L (colour axes). Diagram calculated from the macrospin model for a cylinder with $K_S=0$ J/m$^2$ and $K_u=0$ J/m$^3$.

FIG. 15 shows $\Delta$ as a function of D in the macrospin approximation, for a cylinder with $K_S=0$ J/m$^2$ and $K_u=0$ J/m$^3$. These curves clearly show that a maximum of $\Delta(D)$ is always attainable, whatever the value of the thickness and the $M_S$ of the layer. Being placed around this maximum is advantageous because this shows that the thermal stability factor $\Delta$ is then slightly dependent on the exact diameter of the pillar constituted by the magnetic tunnel junction. It is easy to be convinced of this by plotting these same curves for different values of $K_S$ and $K_u$ which, in the operating regime of PSA-MRAMs, the function $\Delta(D)$ always has a single maximum. Thus, even in the presence of given interfacial volume anisotropy: $K_S$ and $K_u$, there exists a single optimal solution $\{L^{opti}, M_S^{opti}\}$ that minimises the effects of a variability in diameter on the stability, for a predefined stability and technological node (i.e. a diameter).

The calculations below present an analytical resolution of the parameters $\{L^{opti}, M_S^{opti}\}$ in the limit of the approximation of the approximate expression of the demagnetising factors of a uniformly magnetised cylinder mentioned above. The numerical applications will be made for certain anisotropy values $K_S$ and $K_u$ typically achievable with materials of those skilled in the art. The invention is in no way limited to the case of the uniformly magnetised cylinder or to the anisotropy values chosen as an example. In order to simplify the expressions, constants "a", "b" and "c" are introduced into the expression of the thermal stability factor.

$$\Delta = aLD^2\left(1 - \frac{3D}{D+bL}\right) + cD^2(K_u L + K_S) \text{ where}$$

$$a = \frac{\pi \mu_0 M_S^2}{16 k_B T}$$

$$b = \frac{4}{\sqrt{\pi}}$$

$$c = \frac{\pi}{4 k_B T}$$

The optimisation condition is written:

$$\frac{\partial \Delta}{\partial D} = \frac{2\Delta}{D} - \frac{3abL^2 D^2}{(D+bL)^2} = 0 \Rightarrow a = \frac{2\Delta(D+bL)^2}{3bL^2 D^3}$$

This expression of "a" is injected into the expression of the thermal stability factor. After simplifications, it is possible to extract a quadratic equation in L.

$$L^2 \left[\frac{1}{2} + \frac{3cD^3 K_u}{4b\Delta}\right] + L\left[-\frac{5D}{4b} + \frac{3cD^3 K_S}{4b\Delta}\right] - \frac{D^2}{b^2} = 0$$

Among the two roots $L_\pm$, only $L_+$ is positive and thus correspond to the optimal thickness previously designated $L^{opti}$.

$$L^{opti} = \frac{1}{1 + \frac{3cD^3 K_u}{2b\Delta}} \left[\frac{5D}{4b} - \frac{3cD^3 K_S}{4b\Delta} + \sqrt{\left(\frac{5D}{4b} - \frac{3cD^3 K_S}{4b\Delta}\right)^2 + \frac{2D^2}{b^2}\left(1 + \frac{3cD^3 K_u}{2b\Delta}\right)}\right]$$

$M_S^{opti}$ is deduced therefrom:

$$M_S^{opti} = \sqrt{\frac{16 k_B T}{\pi \mu_0} \frac{2\Delta(D + bL^{opti})^2}{3b(L^{opti})^2 D^3}}$$

As an example, several examples of standard magnetic materials are listed having a magnetisation $M_S^{FM\ opti}$ which minimises the variability of $\Delta_{300}$ for junction diameter values between 10 nm and 25 nm:
  FM=cobalt. A layer of 15 nm of Co ($M_S$=1.446 10$^6$ A/m, $K_u$=0 J/m$^3$) corresponds to the optimal layer for a junction diameter of D=10.8 nm.
  FM=iron. A layer of 13.4 nm of Fe ($M_S$=1.714 10$^6$ A/m, $K_u$=0 J/m$^3$) corresponds to the optimal layer for a junction diameter of D=9.6 nm.
  FM=Permalloy (Py). A layer of 23.1 nm of Py ($M_S$=0.756 10$^6$ A/m, $K_u$=0 J/m$^3$) corresponds to the optimal layer for a junction diameter of D=16.6 nm.
  FM=CoFe alloys. These alloys are optimal for junction diameters comprised between 10 and 15 nm.
  FM=Co$_2$FeAl (full-Heusler). A layer of around 6 nm of Co$_2$FeAl ($M_S$=1.3 10$^6$ A/m, $K_u$=0.3 10$^6$ J/m$^3$) corresponds to the optimal layer for diameters of around 25 nm.

Finally, in the case of a bilayer comprising an interface based on FeCoB of which the properties are assumed to be optimised for other reasons (TMR, RA, spin polarisation, etc.) as well as a volume layer noted FM, the optimal characteristics (optimal thickness $L^{FM\ opti}$ and optimal magnetisation $M_s^{FM\ opti}$) of the layer FM are given by:

$$\begin{cases} L^{FM\ opti} = L^{opti} - L^{FeCoB} \\ M_S^{FM\ opti} = \dfrac{M_S^{opti} L^{opti} - M_S^{FeCoB} L^{FeCoB}}{L^{opti}} \end{cases}$$

Figure 1B:
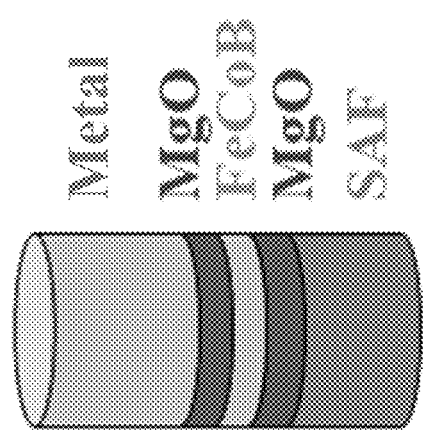
FIG. 1B: Schematic representation of a standard STT-MRAM stack with double MgO barrier and a non-magnetic upper electrode according to the prior art.
Figure 1A:
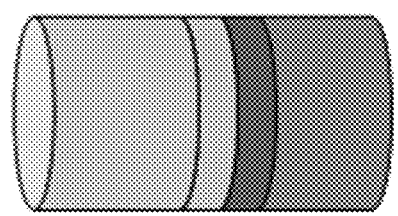
FIG. 1A: Schematic representation of a STT-MRAM stack with single MgO barrier and a non-magnetic upper electrode according to the prior art.
Figure 2:
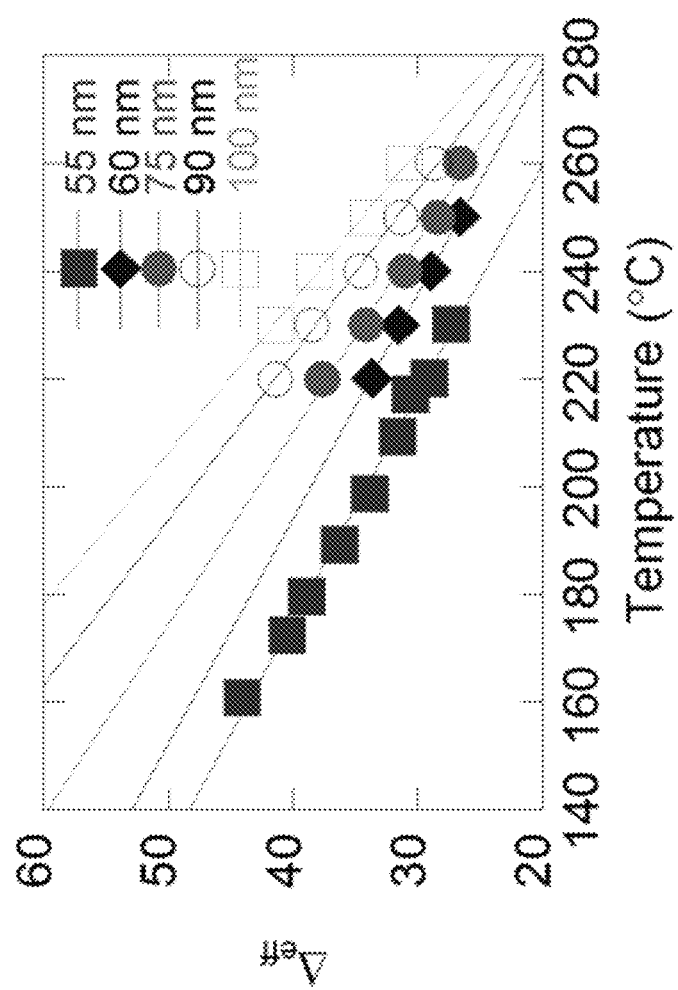
FIG. 2: Temperature evolution of the thermal stability factor of p-STT-MRAMs of the prior art with out-of-plane magnetisation for tunnel junctions of diameter between 100 nm and 44 nm.
Figure 3:
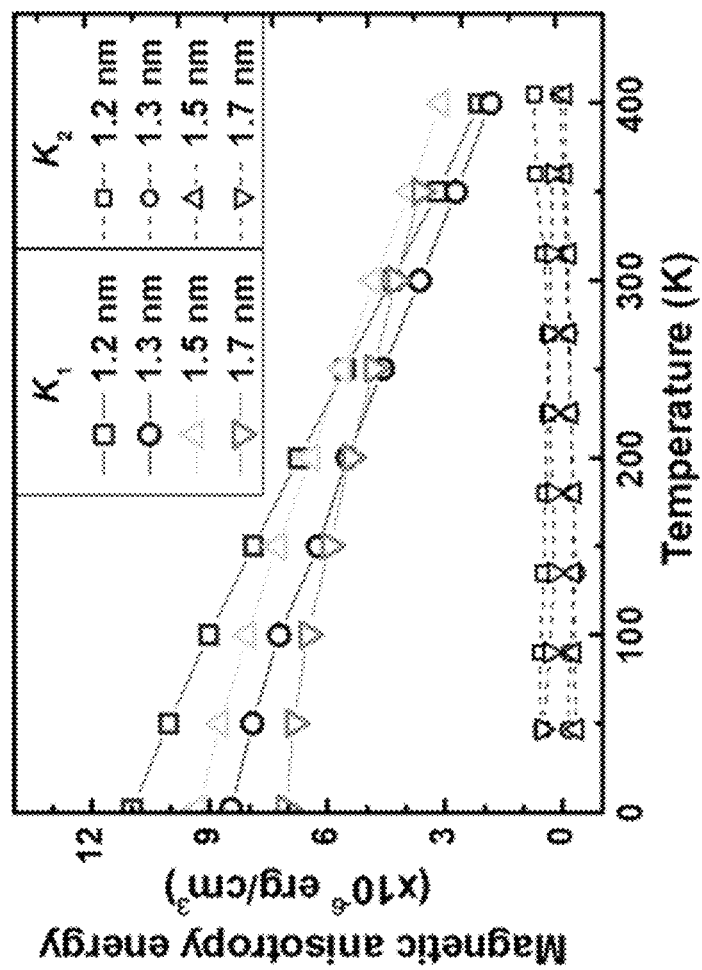
FIG. 3: Temperature dependency of the interfacial anisotropy of first order (uniaxial in sin$^2$ θ, θ angle between the magnetisation of the storage layer and the normal to the plane of the layers) and of second order (in sin$^4$ θ) of W/CoFeB/MgO multilayers with different thicknesses of CoFeB. Taken from Kyoung-Min Lee et al., "Temperature dependence of the interfacial magnetic anisotropy in W/CoFeB/MgO", AIP Advances 7, 065107 (2017)
Figure 4:
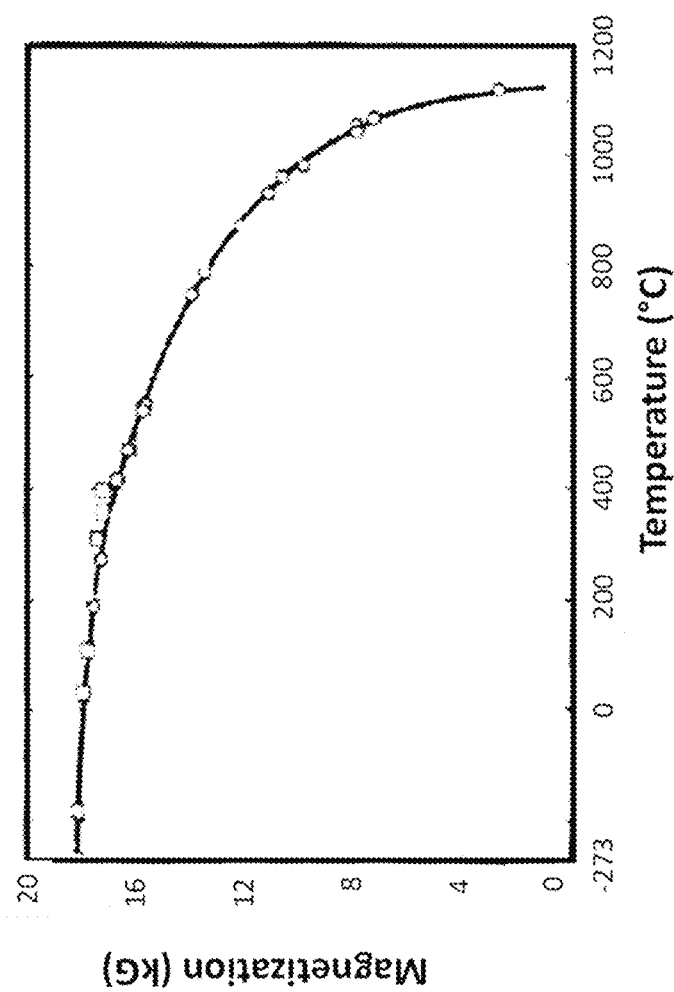
FIG. 4: Thermal variation of the magnetisation of bulk cobalt.
Figure 5:
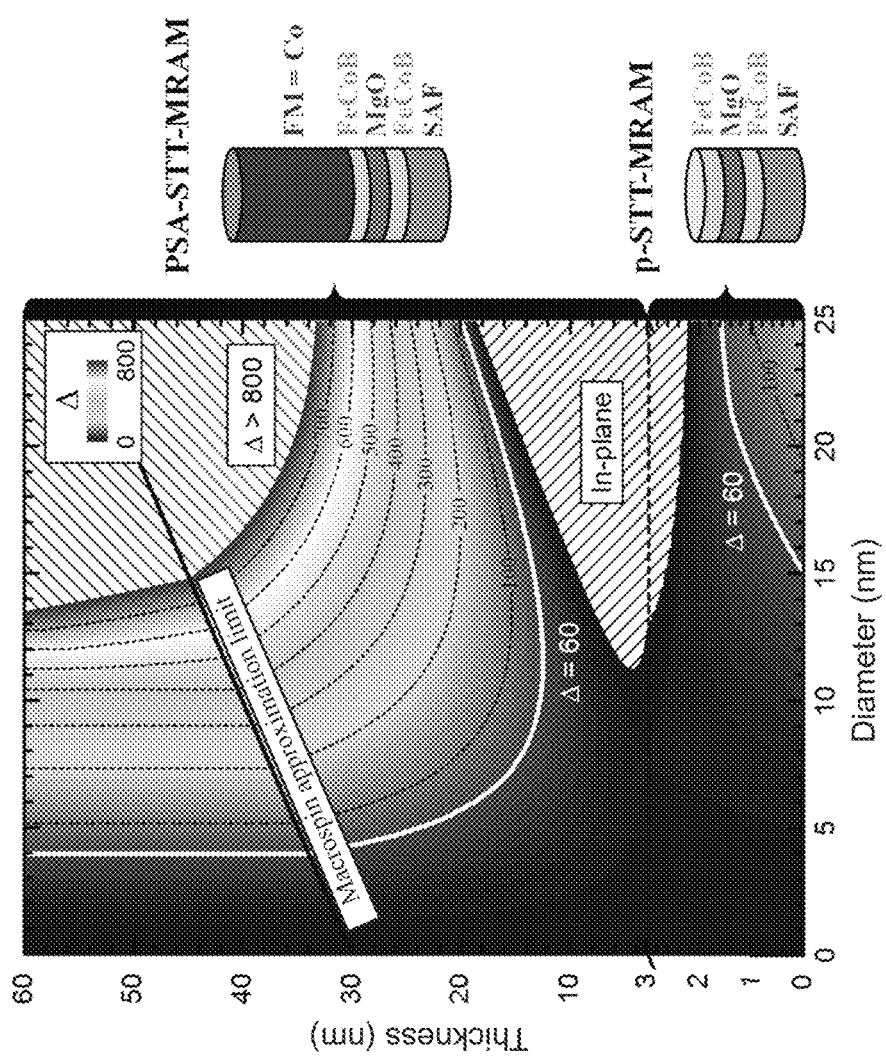
FIG. 5: Thermal stability factor (grey levels) as a function of the diameter and the thickness of the storage layer.

This point corresponds to the maxima of the iso-$M_S$ of FIG. 15 or instead to the minima iso-$\Delta$ of FIG. 5.

FIGS. 14A-D represents $L^{FM\ opti}$ and $M_s^{FM\ opti}$ as a function of the technological node (identified here at the diameter of the memory point) for a stability $\Delta=60$ at 300 K, for a stack having or not surface anisotropy. Two volume anisotropy values are presented therein.

The graphs illustrated in FIGS. 14a to 14d represent the graphs of $M_S^{FM\ opti}$ and $t^{FM\ opti}$ calculated for different anisotropy values $K_s$ and $K_u$ as a function of the diameter of the tunnel junction.

In order to minimise the dispersion of thermal stability factor and writing current from one memory point to the next, a position will be taken in conditions such that $$\left|\frac{\partial \Delta}{\partial D}\right| < crit$$

Where crit is a positive dispersion tolerance constant. This tolerance is defined by the fact that the distributions of writing voltage, reading voltage and dielectric breakdown voltage have to be well separated as is known to those skilled in the art. Typically, it will be sought to have a dispersion of $\Delta$ below 40 (that is to say for example $\Delta=80\pm20$ for a dispersion of diameter of tunnel junctions of $\pm2$ nm) i.e.

$$\left|\frac{\partial \Delta}{\partial D}\right| < 10\ nm^{-1}.$$

However to produce high capacity memories (several Gbits), it will be necessary to have a narrower writing voltage distribution thus a stricter criterion $$\left|\frac{\partial \Delta}{\partial D}\right| < 3\ nm^{-1}$$

or even $$\left|\frac{\partial \Delta}{\partial D}\right| < 1\ nm^{-1}.$$

This signifies working closer and closer to the optimal condition defined by $L^{FM\ opti}$ and $Ms^{FM\ opti}$.

In the case of a storage layer constituted of a single homogenous material of uniform magnetisation, the condition $$\left|\frac{\partial \Delta}{\partial D}\right| < crit$$

is written $$\left|\frac{2\Delta}{D} - \frac{3abL^2 D^2}{(D+bL)^2}\right| < crit$$

where the constants a and b have been defined previously.

FIG. 15 illustrates the zones of parameters (diameter (D), thickness (L)) in which a value $$\left|\frac{\partial \Delta}{\partial D}\right|$$

is obtained below a certain criterion crit equal to 5, 10, or 20 $nm^{-1}$ in the figure. The figure is represented in multiscale form making it possible to cover different types of materials represented by their magnetisation in colour code. To establish this figure, the variations of stability $\delta\Delta$ are calculated, which implies a given variation of diameter $\delta D$ (that is to say $$\left|\frac{\partial \Delta}{\partial D}\right|),$$

as a function of the parameters D, $\Delta$, L and $M_S$ and by considering $K_S=0$ and $K_u=0$. The value of $$\left|\frac{\partial \Delta}{\partial D}\right|$$

is then plotted in hatching code as a function of $\Delta$ (Y-axis) and of D (X-axis), for all $M_S$ (colour code) and for different values of L (coloured axes). Vertical hatchings indicate that $$\left|\frac{\partial \Delta}{\partial D}\right| < 5\ nm^{-1},$$

horizontal hatchings indicate that $$5 < \left|\frac{\partial \Delta}{\partial D}\right| < 10\ nm^{-1},$$

cross hatchings indicate that $$10 < \left|\frac{\partial \Delta}{\partial D}\right| < 20\ nm^{-1}$$

and everything that is beyond the hatchings indicates that $$\left|\frac{\partial \Delta}{\partial D}\right| > 20 \text{ nm}^{-1}.$$

For example, it is reasonable to consider that Δ must not vary by more than ±20 for variations of diameter of ±2 nm, i.e.

$$\left|\frac{\partial \Delta}{\partial D}\right| < 10 \text{ nm}^{-1}.$$

Thus, the vertical and horizontal hatched zones show all the domain in which it is possible to be placed while satisfying this property. For example, let us consider the case of cobalt (curve iso-$M_S$=Co) with a thickness L=15 nm (blue axes). The optimal conditions $$\left(\left|\frac{\partial \Delta}{\partial D}\right| = 0\right)$$

of this case correspond to the maximum of the iso-$M_S$ and roughly corresponds to the operating point {D=10.9 nm, Δ=60}. On the other hand, if the criterion is $$\left|\frac{\partial \Delta}{\partial D}\right| < 10 \text{ nm}^{-1}$$

for example instead of being $$\left|\frac{\partial \Delta}{\partial D}\right| = 0$$

but that it is specifically wished to have Δ=55, then it is possible by moving towards the left on the iso-$M_S$ to find an operating point {D=8.8 nm, Δ=55} which always satisfies the desired criterion. The criterion is no longer satisfied for around D<8.1 nm, which leaves the possibility of having a method variability of ±0.7 nm.

Figure 16:
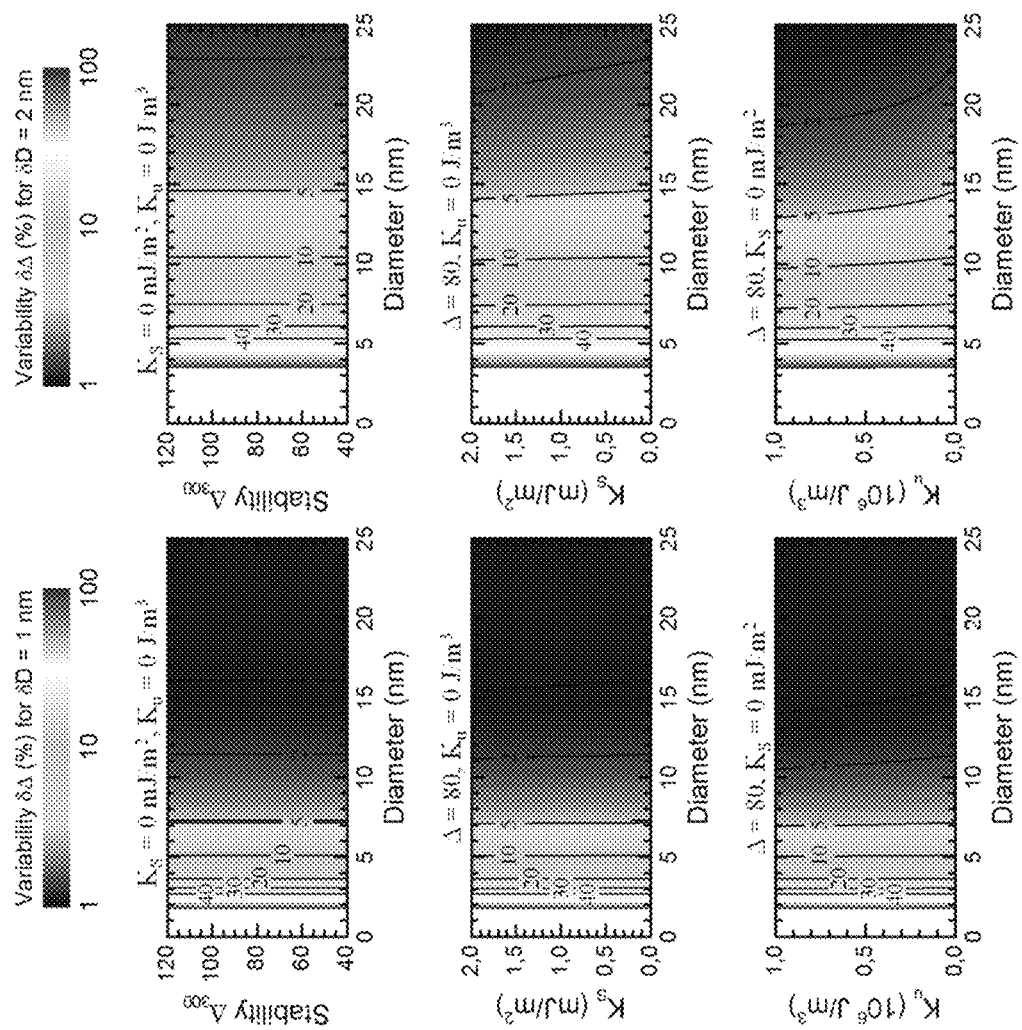
FIG. 16: Graphs representing in colour code the variability of the thermal stability factor (and thus also of the writing current) as a function of the diameter of the cell for two given variabilities of the diameter of the cell (variability associated with the etching method: δD=1 nm left column, δD=2 nm, right column). In these figures, 3 parameters have been varied Δ, $K_s$ and $K_u$. The vertical scales each represent one of these parameters, the two others being fixed. For each set of values of parameters Δ, $K_s$ and $K_u$, D, the thickness L and the magnetisation $M_S$ are chosen to correspond to the optimal parameters $\{L^{opti}, M_S^{opti}\}$.

FIG. 16 shows another manner of presenting the influence of the variability of the thermal stability factor for a given variability in cell diameter δD (1 nm or 2 nm in FIG. 16) as a function of the diameter of the cell in different surface and volume anisotropy conditions. For each diameter value, and fixed anisotropy parameters $K_s$ and $K_u$, the optimal conditions of thickness and of magnetisation {$L^{opti}$, $M_S^{opti}$} are chosen.

To do so, the results presented in FIG. 16 are calculated in the following manner. The X-axis represents the target diameter D. The Y-axis represents a variable parameter Δ, $K_S$ or $K_u$, the two others being fixed. For each point of the diagrams, the optimal parameters {$L^{opti}$, $M_S^{opti}$} are calculated via the method described previously. By using all of these parameters, the relative variation of maximal stability δΔ (in % of the target stability Δ) during a variability of the diameter D±δD is plotted in colour code. In other words, for all values of diameter ∈[D−δD; D+δD], there is a stability ∈[Δ(1−δΔ); Δ(1+δΔ)]. The diagrams are calculated for δD=1 nm (left column) and δD=2 nm (right column). These diagrams make it possible to conclude that for the largest diameters (D>15 nm), it may be advantageous to have a surface or volume anisotropy since the latter reduce the variability δΔ. On the other hand they only have little influence at small diameters (D<15 nm). In addition, for the largest diameters, the variability δΔ is generally less than 2%, which is low and which makes it possible to be positioned relatively far from the optimal conditions presented in the present patent. On the other hand, the smaller the diameter, the more the variability δΔ at the optimal conditions increases. As an example, δΔ reaches some 40% for δD=1 nm at D=2.7 nm, and δΔ reaches some 40% for δD=2 nm at D=5.3 nm. Thus, if δD=2 nm is the uncertainty on the method and δΔ=40% the maximum allowed stability variation, then if the target diameter is 5 nm, then it is necessary to be placed very close to the optimal conditions {$L^{opti}$, $M_S^{opti}$} since elsewhere the variability δΔ can only get worse.

It is to be noted that in certain situations and in particular towards the smallest technological nodes (4 nm), it may become impossible to find a material having an optimal magnetisation $M_S^{FM\ opti}$, whether it is for purely physical reasons (for example no material having the optimal magnetisation if it is too high) or because said materials do not satisfy other criteria (for example necessity of having a low Gilbert dampening). This can take place in particular towards the smallest technological nodes in so far as, generally speaking, the optimal magnetisation of the material of the ferromagnetic storage layer increases when the diameter of the tunnel junction decreases. In this case, if it becomes impossible to satisfy the equality $$\frac{\partial \Delta}{\partial D} = 0,$$

it will be sought to be placed at the lowest accessible point $$\left(\left|\frac{\partial \Delta}{\partial D}\right|\right).$$

An analysis of the diagrams such as that given in FIG. 15 leads to the fact that it is necessary to choose the material having the greatest magnetisation $M_S$ (with $M_S < M_S^{opti}$), then to adapt the thickness to obtain the desired stability. In this case, the thickness is obtained according to:

$$L = \frac{1}{2(abD^2 + bcD^2K_u)}$$
$$[(2aD^3 + b\Delta - cD^3K_u - bcD^2K_S) +$$
$$\sqrt{(2aD^3 + b\Delta - cD^3K_u - bcD^2K_S)^2 + 4(abD^2 + bcD^2K_u)(D\Delta - cD^3K_S)}\,]$$

It should be noted that the values of $L^{FM\ opti}$ and $Ms^{FM\ opti}$ depend on temperature. Advantageously, for a device having to operate over a temperature range of $T_{min}$ to $T_{max}$, for example 0° C. to 85° C., it will be sought to come closer to the optimal conditions at the average temperature ($T_{min}$+$T_{max}$)/2.

It should be noted that is it also possible to give to the reference layer a vertically elongated shape in order to increase its perpendicular anisotropy. However a drawback is that then the field radiated by this layer on the storage layer becomes very important such that it can become necessary to compensate this radiated field by the application of a compensation magnetic field.

The invention claimed is:

1. A magnetic tunnel junction with out-of-plane magnetisation including:
   a storage layer having a magnetisation switchable between two magnetisation states perpendicular to a plane of the layer;
   a reference layer having a fixed magnetisation and perpendicular to the plane of the layer;
   a tunnel barrier layer separating the storage layer and the reference layer;
   the two magnetisation states of the storage layer being separated by an energy barrier including a contribution due to the shape anisotropy of the storage layer and a contribution of interfacial origin for each interface of the storage layer, wherein:
   the storage layer has a thickness comprised between 0.8 and 8 times a characteristic dimension of a planar section of the tunnel junction;
   and the contribution to the energy barrier due to the shape anisotropy of the storage layer is at least two times greater than the contributions to the energy barrier of interfacial origin;
   the storage layer comprising an interfacial layer made of an alloy rich in cobalt in contact with the tunnel barrier.

2. The magnetic tunnel junction according to claim 1, wherein the storage layer comprises a volume layer having a Curie temperature above 400° C.

3. The magnetic tunnel junction according to claim 1, comprising a single tunnel barrier layer.

4. The magnetic tunnel junction according to claim 1, wherein the contribution to the energy barrier due to the shape anisotropy of the storage layer is at least four times greater than the contributions to the energy barrier of interfacial origin.

5. The magnetic tunnel junction according to claim 1, wherein the storage layer includes one or more magnetic materials having a Curie temperature above 400° C.

6. The magnetic tunnel junction according to claim 1, wherein the storage layer includes an alloy including cobalt and/or iron and an amorphising element, said alloy being in contact with the tunnel barrier layer.

7. The magnetic tunnel junction according to claim 6, wherein the storage layer contains one or more layers of materials able to absorb the amorphising element present in the storage layer and to ensure structural transitions between the different magnetic materials comprised in the storage layer.

8. The magnetic tunnel junction according to claim 1, wherein its section is circular or quasi-circular and the characteristic dimension is the diameter of the section.

9. The magnetic tunnel junction according to claim 8, wherein the diameter is less than 50 nm.

10. The magnetic tunnel junction according to claim 1, wherein:
    the tunnel barrier layer is made of MgO, AlOx, AlN, $SrTiO_3$, HfOx or any other insulating oxide or nitride;
    the storage layer includes:
      a layer made of alloy of cobalt, iron and amorphising element of thickness between 1 and 4 nm in contact with the tunnel barrier;
      a layer of a material able to absorb boron at the moment of post-deposition annealing, of 0.2 to 0.4 nm thickness;
      a magnetic layer with low Gilbert dampening.

11. The magnetic tunnel junction according to claim 1, wherein:
    said magnetic tunnel junction has a stability factor dependent on the energy barrier and the temperature of use of the magnetic tunnel junction;
    the composition and the thickness of the storage layer are chosen such that the absolute value of the derivative of the thermal stability factor compared to a characteristic dimension of a planar section of the tunnel junction is less than 10 $nm^{-1}$, the derivative of the stability factor being calculated at a temperature $T_m$, the temperature $T_m$ being the average temperature of use of the magnetic tunnel junction.

12. A magnetic random access memory point of spin-transfer torque or STT-MRAM type including a magnetic tunnel junction according to claim 1.

13. A magnetic random access memory point of spin-orbit transferor SOT-MRAM type including a magnetic tunnel junction according to claim 1.

14. A magnetic random access memory point with voltage controlled writing including a magnetic tunnel junction according to claim 1.

15. A non-volatile element of a logic component including a magnetic tunnel junction according to claim 1.

16. A method for manufacturing a magnetic tunnel junction according to claim 1 comprising:
    depositing all of the layers by physical vapour deposition;
    etching the storage layer or thick magnetic layer by reactive ion etching;
    etching the other layers by ion beam etching.

17. The magnetic tunnel junction according to claim 2, wherein the Curie temperature is above 800° C.

18. The magnetic tunnel junction according to claim 5, wherein the Curie temperature is above 800° C.

19. The magnetic tunnel junction according to claim 6, wherein the amorphising element is boron.

20. The magnetic tunnel junction according to claim 10, wherein the layer of a material able to absorb boron is a layer of Ta, Mo, W, or Hf.

* * * * *